(12) United States Patent
Soda

(10) Patent No.: US 6,496,555 B1
(45) Date of Patent: Dec. 17, 2002

(54) PHASE LOCKED LOOP

(75) Inventor: Masaaki Soda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/358,637

(22) Filed: Jul. 21, 1999

(30) Foreign Application Priority Data

Jul. 22, 1998 (JP) .......................................... 10-205973
Oct. 14, 1998 (JP) .......................................... 10-291244

(51) Int. Cl.[7] ................................................. H03D 3/24

(52) U.S. Cl. ........................ 375/376; 375/375; 327/156

(58) Field of Search ................................. 375/376, 327, 375/375; 327/147, 156; 331/11

(56) References Cited

U.S. PATENT DOCUMENTS

| 4,590,602 A | * | 5/1986 | Wolaver | 375/376 |
| 5,841,323 A | * | 11/1998 | Fujimoto | 331/11 |
| 6,259,755 B1 | * | 7/2001 | O'Sullivan et al. | 375/376 |

FOREIGN PATENT DOCUMENTS

| JP | 64-27317 | 1/1989 |
| JP | 64-49176 | 2/1989 |
| JP | 3-62645 | 3/1991 |
| JP | 4-284024 | 10/1992 |
| JP | 4-356820 | 12/1992 |
| JP | 5-56029 | 3/1993 |
| JP | 5-167570 | 7/1993 |
| JP | 6-338790 | 12/1994 |
| JP | 7-131448 | 5/1995 |
| JP | 8-316802 | 11/1996 |
| JP | 9-46619 | 2/1997 |
| JP | 10-97768 | 4/1998 |
| JP | 10-112141 | 4/1998 |

OTHER PUBLICATIONS

Japanese Office Action issued Mar. 6, 2001 in a related application with English translation of relevant portions.
Japanese Office Action issued Jun. 8, 1999, in related application.
English translation of relevant portions of Jun. 8, 1999, Japanese Office Action.
H. Ransijn, et al., "A PLL–Based 2.5–Gb/s GaAs Clock and Data Regenerator IC", *IEEE Journal of Solid–State Circuits*, vol. 26, No. 10, Oct. 1991, pp. 1345–1353.
c. Hogge, "A Self Correcting Clock Recovery Circuit", *Journal of Lightwave Technology*, vol. LT–3, No. 6, Dec. 1985, pp. 1312–1314.

* cited by examiner

Primary Examiner—Temesghen Ghebretinsae
(74) Attorney, Agent, or Firm—Dickstein, Shapiro, Morin & Oshinsky, L.L.P.

(57) ABSTRACT

A PLL comprising a VCO, a phase comparator, a frequency comparator and a filter realizes an enlarged pull-in frequency range and increased operating frequency. The VCO generates a first clock signal and a second clock signal whose frequency is the same as that of the first clock signal and whose phase is ahead of that of the first clock signal. An input data signal is inputted to the phase comparator and the frequency comparator. The first clock signal is supplied to the phase comparator and the frequency comparator, and the second clock signal is supplied to the frequency comparator. The phase comparator executes phase comparison between the first clock signal and the input data signal, and outputs the result of the phase comparison. The frequency comparator which is composed of digital components executes frequency comparison between the clock signal and the input data signal based on the timing when the first clock signal changes its value and the value of the second clock signal at the timing, and outputs the result of the frequency comparison. The filter removes high frequency components from the outputs of the phase comparator and the frequency comparator and adds them together and thereby generates a control signal for controlling the oscillation frequency of the voltage controlled oscillator.

27 Claims, 16 Drawing Sheets (a) INPUT DATA (b) VCO OUTPUT (CLOCK)

(c) DFF1 OUTPUT (d) DFF2 OUTPUT (e) EXOR1 OUTPUT (f) EXOR2 OUTPUT (g) ADDER OUTPUT (a) INPUT DATA (b) VCO OUTPUT (CLOCK)

(c) DFF1 OUTPUT (d) DFF2 OUTPUT (e) EXOR1 OUTPUT (f) EXOR2 OUTPUT (g) ADDER OUTPUT

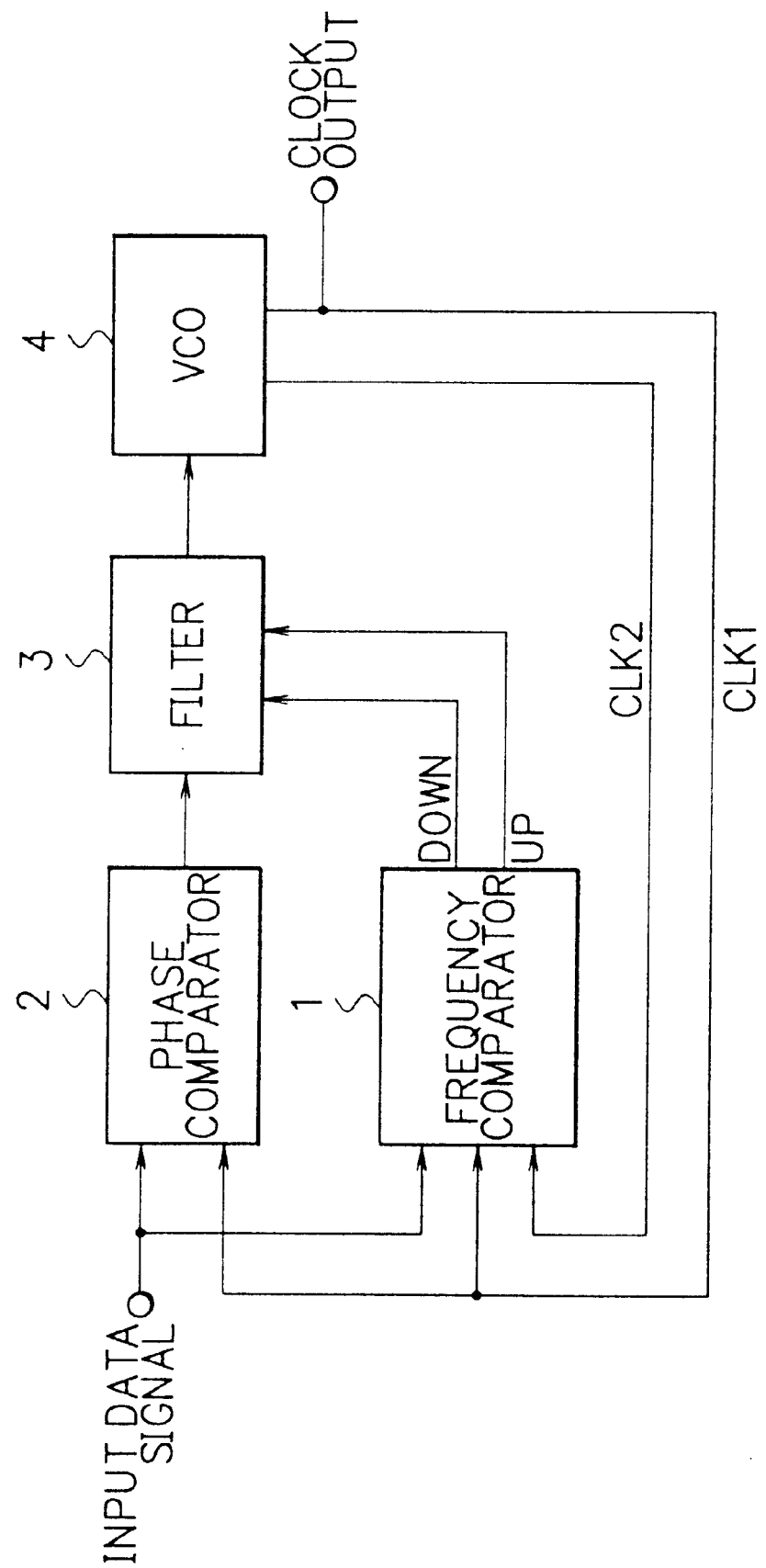
F I G. 5

F I G. 11
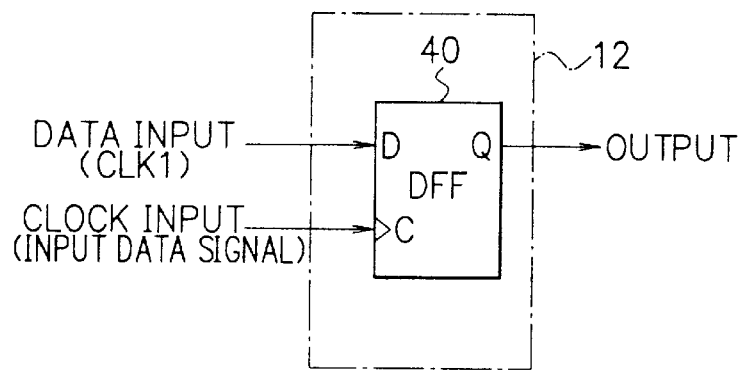
F I G. 12
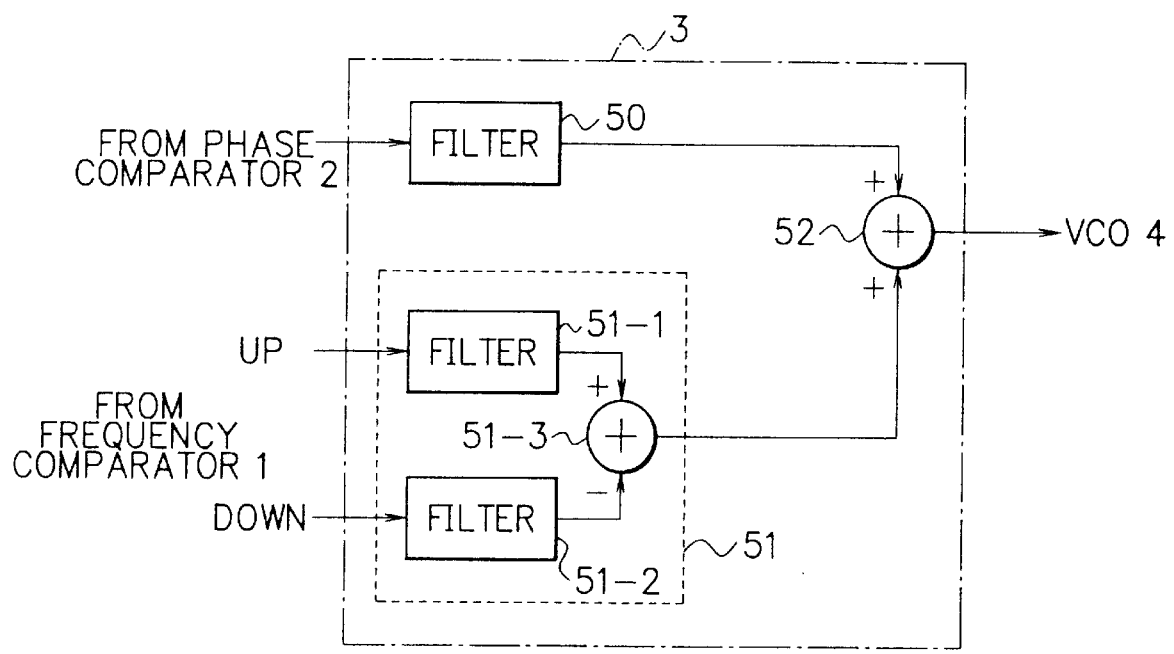

- (a) INPUT DATA
- (b) CLOCK
- (c) DECISION OUTPUT
- (d) DFF OUTPUT
- (e) D-LATCH1 OUTPUT
- (f) D-LATCH2 OUTPUT
- (g) SELECTOR OUTPUT

- (a) INPUT DATA
- (b) CLOCK
- (c) DECISION OUTPUT
- (d) DFF OUTPUT
- (e) D-LATCH1 OUTPUT
- (f) D-LATCH2 OUTPUT
- (g) SELECTOR OUTPUT

PHASE LOCKED LOOP

BACKGROUND OF THE INVENTION

The present invention relates to a phase locked loop, and in particular, to a phase locked loop having the capability of high speed operation.

DESCRIPTION OF THE PRIOR ART

Clock recovery circuits employing PLLs (Phase Locked Loops) have become very important in the field of data communication especially for miniaturizing devices, and a variety of PLLs have been proposed and reported. Among such techniques concerning PLLs, a PLL which is provided with a frequency comparator so as to enlarge the pull-in range (pull-in frequency range) has been disclosed in a paper: "A PLL-Based 2.5-Gb/s GaAs Clock and Data Regenerator IC", IEEE Journal of Solid-State Circuit, vol.26, No.10, pages 1345–1353 (October 1991).

FIG. 1 is a circuit diagram showing a conventional PLL which is disclosed in the above document. The PLL shown in FIG. 1 comprises a D-FF 70, a delay circuit 71, an EXOR circuit 72, a first phase comparator 73, a second phase comparator 74, a VCO (Voltage Controlled Oscillator) 75, a differential circuit 76, a lowpass filter 77 and a mixer 78.

An input signal is delayed by the delay circuit 71 by half the clock cycle, and the delayed input signal is supplied to the EXOR circuit 72. Meanwhile, the input signal is also supplied to the EXOR circuit 72 directly. Thereby a pulse signal is generated by the EXOR circuit 72 when data change occurs in the input signal. The pulse signal is supplied to the first phase comparator 73 and the second phase comparator 74, which compare the phase of the pulse signal with the phase of a clock signal which is generated by the VCO 75. For the comparison, the clock signal having a phase 0° is supplied to the first phase comparator 73, and the clock signal having a phase 90° is supplied to the second phase comparator 74. The output of the first phase comparator 73 is inputted to the differential circuit 76, and thereby a differentiated signal is supplied to the mixer 78. Meanwhile, the output of the second phase comparator 74 is directly inputted to the mixer 78. The mixer 78 multiplies the differentiated signal supplied from the differential circuit 76 and the output of the second phase comparator 74 together. The output of the mixer 78 is returned to the VCO 75 via the lowpass filter 77.

The output of the lowpass filter 77 becomes a DC voltage which is proportional to the frequency difference between the input signal and the clock signal. Therefore, a PLL provided with a frequency comparator is formed by the circuit of FIG. 1 and thereby a PLL having a wide pull-in range is realized.

If we describe the clock signal having the phase 0° and the clock signal having the phase 90° as A sin(($\omega$t) and A cos(($\omega$t) respectively, the output of the first phase comparator 73 can be described as:

$$B \sin(d\omega t + d\theta) \quad (1)$$

and the output of the second phase comparator 74 can be described as:

$$B \cos(d\omega t + d\theta) \quad (2)$$

where $d\omega$ is the frequency difference (angular velocity difference) between the input signal and the clock signal, and $d\theta$ is the phase difference between the input signal and the clock signal.

Since the output of the first phase comparator 73 is inputted to the differential circuit 76, the output of the differential circuit 76 becomes:

$$d\omega B \cos(d\omega t + d\theta) \quad (3).$$

The signals of the expressions (2) and (3) are multiplied together by the mixer 78, therefore, the output of the mixer 78 becomes:

$$d\omega B^2/2 \times (1 + \cos(2(d\omega t + d\theta))) \quad (4).$$

The signal (4) can be divided into a DC component which is proportional to the frequency difference and an AC component whose frequency is twice the frequency difference between the input signal and the clock signal. Therefore, by removing the AC component by the lowpass filter 77, a VCO control voltage which is proportional to the frequency difference can be obtained. By the capability of detecting the frequency difference, a PLL which is capable of enlarging the pull-in range up to the capture range of the VCO regardless of the time constant of the lowpass filter 77 and capable of operating stably is realized.

However, the conventional PLL described above requires precision of each block or component of the PLL since the frequency difference between the clock signal and the input data signal is detected in an analog manner. For example, in cases where the precision of the differential circuit 76 is deteriorated for some reason and the 90° phase shift is not executed by the differential circuit 76 precisely, an offset voltage occurs in the output of the mixer 78. For the offset voltage, an offset compensation has to be done from outside the PLL. Further, such a high precision circuit becomes more and more harder to manufacture as the operating frequency of the PLL becomes high, and thus stable operation of the PLL in higher frequency becomes very difficult. Therefore, a PLL having wide pull-in range and capability of high speed operation is being required today.

Further, even if the pull-in could be done against the input data signal, phase difference tends to occur between the clock signal generated by the VCO and the input data signal as the bit rate of the input data signal becomes higher. In a clock recovery circuit employing a decision circuit for executing data recognition/regeneration and outputting the recognized/regenerated data, such phase difference between the clock signal and the input data signal supplied to the decision circuit has to be eliminated, that is, phase adjustment has to be executed to the clock signal which is inputted to the decision circuit so that edges (rising edges or falling edges) of the clock signal to be used for the data recognition/regeneration by the decision circuit will come to the optimum decision point (i.e. the midpoint of each time slot of the input data signal).

Such phase adjustment used to be executed by inserting a delay circuit etc. in front of the decision circuit. However, techniques for eliminating the need of the phase adjustment have been proposed these days. Such an example of a PLL has been disclosed in a paper: "A Self Correcting Clock Recovery Circuit", IEEE Journal of Lightwave Technology, vol.LT-3, No. 6, pages 1312–1314 (December 1983).

FIG. 2 is a circuit diagram showing the conventional PLL (clock recovery circuit) which is disclosed in the above document. The PLL of FIG. 2 is composed of a phase comparator 80, a filter 81 and a VCO 82. In the phase comparator 80, a first D-FF 83 and a second D-FF 84 are connected in series. The input data signal is supplied to the data input terminal D of the first D-FF 83. The output terminal Q of the first D-FF 83 is connected to the data input terminal D of the second D-FF 84, and thereby recognized/regenerated input data is outputted from the output terminal Q of the second D-FF 84. The clock terminal C of the first D-FF 83 is supplied with the clock signal from the VCO 82, and the clock terminal C of the second D-FF 84 is supplied with an inverted clock signal which is generated by inverting the clock signal from the VCO 82 by an inverter 85. The data input terminal D and the output terminal Q of the first D-FF 83 are connected to a first EXOR circuit 86, and the data input terminal D and the output terminal Q of the second D-FF 84 are connected to a second EXOR circuit 87. The outputs of the first and the second EXOR circuits 86 and 87 are supplied to an adder 88, in which the output of the first EXOR circuit 86 is inputted to the adder 88 so as to be added and the output of the second EXOR circuit 87 is inputted to the adder 88 so as to be subtracted. The output of the adder 88 is supplied to the filter 81, and the output of the filter 81 is returned to the VCO 82 as a control signal.

The PLL of FIG. 2 operates as follows. FIGS. 3 and 4 are timing charts showing the operation of the phase comparator 80 of the conventional PLL of FIG. 2, in which FIG. 3 shows a case where the phase of the clock signal (VCO OUTPUT) is behind the phase of the input data signal and FIG. 4 shows a case where the phase of the clock signal (VCO OUTPUT) is ahead of the phase of the input data signal. Incidentally, the expressions "behind" and "ahead of" are used with respect to falling edges of the clock signal. As shown in FIG. 3(*e*) and FIG. 4(*e*), the output of the first EXOR circuit 86 becomes pulses each of which has a pulse width determined by time difference between a changing point of the input data signal (FIG. 3(*a*) and FIG. 4(*a*)) and a changing point of the clock signal (VCO OUTPUT) (FIG. 3(*b*) and FIG. 4(*b*)). Meanwhile, as shown in FIG. 3(*f*) and FIG. 4(*f*), the output of the second EXOR circuit 87 becomes pulses each of which has a pulse width of half the cycle of the clock signal.

In the case where the phase of the clock signal is behind the phase of the input data signal, the output pulse width of the first EXOR circuit 86 (FIG. 3(*e*)) becomes wider than that of the second EXOR circuit 87 (FIG. 3(*f*)), and thereby the average of the output signal of the adder 88 (FIG. 3(*g*)) via the filter 81 becomes a positive voltage.

On the other hand, in the case where the phase of the clock signal is ahead of the phase of the input data signal, the output pulse width of the first EXOR circuit 86 (FIG. 4(*e*)) becomes narrower than that of the second EXOR circuit 87 (FIG. 4(*f*)), and thereby the average of the output signal of the adder 88 (FIG. 4(*g*)) via the filter 81 becomes a negative voltage.

As described above, the average output voltage of the phase comparator 80 changes depending on the phase difference between the clock signal and the input data signal, therefore, the phase comparator 80 can correctly operate as a phase comparator. The PLL phase-locks when the average output voltage of the phase comparator 80 becomes 0, that is, when the output pulse width of the first EXOR circuit 86 becomes equal to that of the second EXOR circuit 87. At such a moment, the phase (of rising edges) of the clock signal comes to the midpoint of each time slot of the input data signal. The first D-FF 83 and the second D-FF 84 also have a function of a decision circuit. Therefore, by the above composition of the PLL, a clock recovery circuit capable of executing data recognition/regeneration at the optimum decision point of the decision circuit without phase adjustment can be realized.

However, in such a clock recovery circuit employing the conventional PLL, when the phase of the clock signal is ahead of the phase of the input data signal and the phase difference is large, the output pulse width of the first EXOR circuit 86 becomes very narrow. Therefore, the EXOR circuits 86 and 87 are required the capability of high speed operation. Generally, an EXOR circuit can output pulses of enough height and width when the output pulse width is wide enough, however, when the output pulse width becomes narrower, the output pulse amplitude tends to become smaller (depending on the operating speed of the EXOR circuit), and thereby detection of the phase difference becomes impossible. Especially, for Gb/s class signals, the phase comparator employing an IC becomes difficult, since the EXOR circuit is required operating speed of 2 to 3 times the bit rate of the signal.

SUMMARY OF THE INVENTION

It is therefore the primary object of the present invention to provide a phase locked loop having a wide pull-in frequency range and the capability of high speed operation.

Another object of the present invention is to provide a phase locked loop by which need for the phase adjustment of the clock signal in high speed operation and the effect of variations in quality of device elements are eliminated and thereby stable high speed operation is realized.

In accordance with a first aspect of the present invention, there is provided a phase locked loop comprising a voltage controlled oscillator, a phase comparator, a frequency comparator and a filter. The voltage controlled oscillator, whose oscillation frequency is controlled by a control signal, generates and outputs a first clock signal and a second clock signal whose frequency is the same as that of the first clock signal and whose phase is ahead of that of the first clock signal. The phase comparator executes phase comparison between the first clock signal and the input data signal, and outputs the result of the phase comparison. The frequency comparator executes frequency comparison between the clock signal and the input data signal based on the timing when the first clock signal changes its value and the value of the second clock signal at the timing, and outputs the result of the frequency comparison. The filter removes high frequency components from the outputs of the phase comparator and the frequency comparator and adds them together and thereby generates the control signal for controlling the oscillation frequency of the voltage controlled oscillator.

In accordance with a second aspect of the present invention, in the first aspect, the frequency comparator is composed of digital components.

In accordance with a third aspect of the present invention, in the first aspect, the frequency comparator includes a cycle slip detection circuit and an UP/DOWN signal generation circuit. The cycle slip detection circuit samples the first clock signal in sync with changing points of the input data signal, detects change of the value of the sampled first clock signal, and outputs a detection signal when the change of the sampled first clock signal is detected. The UP/DOWN signal generation circuit judges whether the frequency of the clock signal is higher or lower than the frequency of the input data signal when the cycle slip detection circuit outputted the detection signal based on a sampled data of the second clock signal which is obtained by sampling the second clock signal in sync with a changing point of the input data signal, outputs a DOWN signal for decreasing the oscillation frequency of the voltage controlled oscillator when the frequency of the clock signal is judged to be higher than that of the input data signal, and outputs an UP signal for increasing the oscillation frequency of the voltage controlled oscillator when the frequency of the clock signal is judged to be lower than that of the input data signal.

In accordance with a fourth aspect of the present invention, in the third aspect, the cycle slip detection circuit includes a first sample hold circuit whose clock terminal is supplied with the input data signal and whose data input terminal is supplied with the first clock signal, a second sample hold circuit whose clock terminal is supplied with the input data signal and whose data input terminal is supplied with the output of the first sample hold circuit, and an EXOR circuit which is supplied with the outputs of the first sample hold circuit and the second sample hold circuit.

In accordance with a fifth aspect of the present invention, in the fourth aspect, the UP/DOWN signal generation circuit includes a third sample hold circuit whose data input terminal is supplied with the second clock signal and whose clock terminal is supplied with the input data signal, a first AND circuit which is supplied with the outputs of the first sample hold circuit and the third sample hold circuit, a second AND circuit which is supplied with the outputs of the second sample hold circuit and the third sample hold circuit, a first D-FF whose data input terminal is supplied with the output of the first AND circuit and whose clock terminal is supplied with the output of the EXOR circuit, and a second D-FF whose data input terminal is supplied with the output of the second AND circuit and whose clock terminal is supplied with the output of the EXOR circuit. Thereby the DOWN signal is outputted by the first D-FF and the UP signal is outputted by the second D-FF.

In accordance with a sixth aspect of the present invention, in the fourth aspect, the UP/DOWN signal generation circuit includes a third sample hold circuit whose data input terminal is supplied with the second clock signal and whose clock terminal is supplied with the input data signal, a first AND circuit which is supplied with the outputs of the first sample hold circuit and a second D-FF, a second AND circuit which is supplied with the outputs of the second sample hold circuit and a first D-FF, a third AND circuit which is supplied with the outputs of the EXOR circuit and the third sample hold circuit, the first D-FF whose data input terminal is supplied with the output of the first AND circuit and whose clock terminal is supplied with the output of the third AND circuit, and the second D-FF whose data input terminal is supplied with the output of the second AND circuit and whose clock terminal is supplied with the output of the third AND circuit. Thereby the DOWN signal is outputted by the first D-FF and the UP signal is outputted by the second D-FF.

In accordance with a seventh aspect of the present invention, in the fourth aspect, each sample hold circuit of the cycle slip detection circuit includes a first latch, a second latch and a selector. The data input terminal of the first latch is connected with the data input terminal of the sample hold circuit, and the clock terminal of the first latch is connected with the clock terminal of the sample hold circuit. The first latch holds data at its data input terminal from the moment when a rising edge is supplied to its clock terminal till the moment when a falling edge is supplied to the clock terminal. The data input terminal of the second latch is connected with the data input terminal of the sample hold circuit, and the inverted clock terminal of the second latch is connected with the clock terminal of the sample hold circuit. The second latch holds data at its data input terminal from the moment when a falling edge is supplied to its inverted clock terminal till the moment when a rising edge is supplied to the inverted clock terminal. The input terminals of the selector are supplied with the outputs of the first latch and the second latch, and the selection control terminal of the selector is supplied with the input data signal which is supplied to the clock terminal of the sample hold circuit. The selector selects and outputs the output of the first latch or the output of the second latch depending on the logical value of the input data signal which is supplied to the selection control terminal.

In accordance with an eighth aspect of the present invention, in the seventh aspect, the selector selects and outputs the output of the first latch when the logical value of the selection control terminal is "1", and selects and outputs the output of the second latch when the logical value of the selection control terminal is "0".

In accordance with a ninth aspect of the present invention, in the fourth aspect, each sample hold circuit of the cycle slip detection circuit includes a D-FF whose data input terminal is connected with the data input terminal of the sample hold circuit and whose clock terminal is connected with the clock terminal of the sample hold circuit.

In accordance with a tenth aspect of the present invention, in the first aspect, the filter includes a first filter which is provided corresponding to the phase comparator so as to remove high frequency components of the output of the phase comparator, a second filter which is provided corresponding to the frequency comparator so as to remove high frequency components of the output of the frequency comparator, and an adder for adding the outputs of the first filter and the second filter together.

In accordance with an eleventh aspect of the present invention, in the third aspect, the filter includes a first filter which is provided corresponding to the phase comparator so as to remove high frequency components of the output of the phase comparator, a second filter which is provided corresponding to the frequency comparator so as to remove high frequency components of the output of the frequency comparator, and an adder for adding the outputs of the first filter and the second filter together. The second filter generates a voltage for increasing the oscillation frequency of the voltage controlled oscillator when the UP signal is supplied from the frequency comparator, and generates a voltage for decreasing the oscillation frequency of the voltage controlled oscillator when the DOWN signal is supplied from the frequency comparator.

In accordance with a twelfth aspect of the present invention, there is provided a phase locked loop comprising a voltage controlled oscillator, a decision circuit, a phase comparator and a filter. The voltage controlled oscillator generates and outputs a clock signal. The oscillation frequency of the voltage controlled oscillator is controlled by a control signal. The decision circuit executes data recognition/regeneration of an input data signal in sync with rising edges of the clock signal. The phase comparator executes phase comparison between the clock signal and the input data signal by sampling the input data signal in sync with falling edges of the clock signal and sampling the sampled input data signal in sync with changing points of the output of the decision circuit, and outputs the result of the phase comparison. The filter removes high frequency components from the output of the phase comparator and thereby generates the control signal for controlling the oscillation frequency of the voltage controlled oscillator.

In accordance with a thirteenth aspect of the present invention, in the twelfth aspect, the phase comparator is composed of digital components.

In accordance with a fourteenth aspect of the present invention, in the twelfth aspect, the phase comparator includes a first inverter, a D-FF, a second inverter, a third inverter, a first latch, a second latch and a selector. The first inverter inverts the clock signal which is outputted by the voltage controlled oscillator. The D-FF samples the input data signal in sync with rising edges of the clock signal which has been inverted by the first inverter and outputs the sampled data. The second inverter inverts the output of the D-FF. The third inverter inverts the output of the decision circuit. The first latch samples the output of the D-FF in sync with rising edges of the output of the decision circuit, and holds the sampled data while the output of the decision circuit remains "1". The second latch samples the output of the D-FF which has been inverted by the second inverter in sync with rising edges of the output of the decision circuit which has been inverted by the third inverter, and holds the sampled data while the output of the decision circuit which has been inverted by the third inverter remains "1". The selector selects and outputs the output of the first latch when the output of the decision circuit is "1", and selects and outputs the output of the second latch when the output of the decision circuit is "0".

In accordance with a fifteenth aspect of the present invention, in the twelfth aspect, the decision circuit and the phase comparator are supplied with the input data signal via a duty adjustment circuit which adjusts the duty rate of the input data signal to approximately 50%.

In accordance with a sixteenth aspect of the present invention, in the twelfth aspect, the phase comparator includes a first inverter, a first D-FF and a second D-FF. The first inverter inverts the clock signal which is outputted by the voltage controlled oscillator. The first D-FF samples the input data signal in sync with rising edges of the clock signal which has been inverted by the first inverter and outputs the sampled data. The second D-FF samples the output of the first D-FF in sync with rising edges of the output of the decision circuit, and thereby executes phase comparison between the clock signal and the input data signal.

In accordance with a seventeenth aspect of the present invention, in the sixteenth aspect, the second D-FF is supplied with the output of the first D-FF to its data input terminal via a second inverter, and is supplied with the output of the decision circuit to its clock terminal via a third inverter.

In accordance with an eighteenth aspect of the present invention, there is provided a phase locked loop comprising a voltage controlled oscillator, a decision circuit, a phase comparator and a filter. The voltage controlled oscillator generates and outputs a clock signal. The oscillation frequency of the voltage controlled oscillator is controlled by a control signal. The decision circuit executes data recognition/regeneration of an input data signal in sync with falling edges of the clock signal. The phase comparator executes phase comparison between the clock signal and the input data signal by sampling the input data signal in sync with rising edges of the clock signal and sampling the sampled input data signal in sync with changing points of the output of the decision circuit, and outputs the result of the phase comparison. The filter removes high frequency components from the output of the phase comparator and thereby generates the control signal for controlling the oscillation frequency of the voltage controlled oscillator.

In accordance with a nineteenth aspect of the present invention, in the eighteenth aspect, the phase comparator is composed of digital components.

In accordance with a twentieth aspect of the present invention, in the eighteenth aspect, the phase comparator includes a first inverter, a D-FF, a first inverter, a second inverter, a first latch, a second latch and a selector. The first inverter inverts the clock signal which is outputted by the voltage controlled oscillator. The D-FF samples the input data signal in sync with rising edges of the clock signal and outputs the sampled data. The first inverter inverts the output of the D-FF. The second inverter inverts the output of the decision circuit. The first latch samples the output of the D-FF in sync with rising edges of the output of the decision circuit, and holds the sampled data while the output of the decision circuit remains "1". The second latch samples the output of the D-FF which has been inverted by the first inverter in sync with rising edges of the output of the decision circuit which has been inverted by the second inverter, and holds the sampled data while the output of the decision circuit which has been inverted by the third inverter remains "1". The selector selects and outputs the output of the first latch when the output of the decision circuit is "1", and selects and outputs the output of the second latch when the output of the decision circuit is "0".

In accordance with a twenty-first aspect of the present invention, in the eighteenth aspect, the decision circuit and the phase comparator are supplied with the input data signal via a duty adjustment circuit which adjusts the duty rate of the input data signal to approximately 50%.

In accordance with a twenty-second aspect of the present invention, in the eighteenth aspect, the phase comparator includes a first D-FF and a second D-FF. The first D-FF samples the input data signal in sync with rising edges of the clock signal and outputs the sampled data. The second D-FF samples the output of the first D-FF in sync with rising edges of the output of the decision circuit, and thereby executes phase comparison between the clock signal and the input data signal.

In accordance with a twenty-third aspect of the present invention, in the twenty-second aspect, the second D-FF is supplied with the output of the first D-FF to its data input terminal via a first inverter, and is supplied with the output of the decision circuit to its clock terminal via a second inverter.

In accordance with a twenty-fourth aspect of the present invention, there is provided a phase locked loop comprising a voltage controlled oscillator, a decision circuit, a phase comparator, a frequency comparator and a filter. The voltage controlled oscillator, whose oscillation frequency is controlled by a control signal, generates and outputs a first clock signal and a second clock signal whose frequency is the same as that of the first clock signal and whose phase is ahead of that of the first clock signal. The decision circuit executes data recognition/regeneration of an input data signal in sync with rising edges of the first clock signal. The phase comparator executes phase comparison between the first clock signal and the input data signal by sampling the input data signal in sync with falling edges of the first clock signal and sampling the sampled input data signal in sync with changing points of the output of the decision circuit, and outputs the result of the phase comparison. The frequency comparator executes frequency comparison between the clock signal and the input data signal based on the timing when the first clock signal changes its value and the value of the second clock signal at the timing, and outputs the result of the frequency comparison. The filter removes high frequency components from the outputs of the phase comparator and the frequency comparator and adds them together and thereby generates the control signal for controlling the oscillation frequency of the voltage controlled oscillator.

In accordance with a twenty-fifth aspect of the present invention, in the twenty-fourth aspect, the decision circuit, the phase comparator and the frequency comparator are supplied with the input data signal via a duty adjustment circuit which adjusts the duty rate of the input data signal to approximately 50%.

In accordance with a twenty-sixth aspect of the present invention, there is provided a phase locked loop comprising a voltage controlled oscillator, a decision circuit, a phase comparator, a frequency comparator and a filter. The voltage controlled oscillator, whose oscillation frequency is controlled by a control signal, generates and outputs a first clock signal and a second clock signal whose frequency is the same as that of the first clock signal and whose phase is ahead of that of the first clock signal. The decision circuit executes data recognition/regeneration of an input data signal in sync with falling edges of the first clock signal. The phase comparator executes phase comparison between the first clock signal and the input data signal by sampling the input data signal in sync with rising edges of the first clock signal and sampling the sampled input data signal in sync with changing points of the output of the decision circuit, and outputs the result of the phase comparison. The frequency comparator executes frequency comparison between the clock signal and the input data signal based on the timing when the first clock signal changes its value and the value of the second clock signal at the timing, and outputs the result of the frequency comparison. The filter removes high frequency components from the outputs of the phase comparator and the frequency comparator and adds them together and thereby generates the control signal for controlling the oscillation frequency of the voltage controlled oscillator.

In accordance with a twenty-seventh aspect of the present invention, in the twenty-sixth aspect, the decision circuit, the phase comparator and the frequency comparator are supplied with the input data signal via a duty adjustment circuit which adjusts the duty rate of the input data signal to approximately 50%.

BRIEF DESCRIPTION OF THE DRAWINGS

The objects and features of the present invention will become more apparent from the consideration of the following detailed description taken in conjunction with the accompanying drawings, in which:

FIGS. 3 and 4 are timing charts showing the operation of a phase comparator of the conventional PLL of FIG. 2, in which FIG. 3 shows a case where the phase of the clock signal is behind that of the input data signal and FIG. 4 shows a case where the phase of the clock signal is ahead of that of the input data signal;

FIG. 5 is a block diagram showing a PLL according to a first embodiment of the present invention;

FIGS. 7 and 8 are timing charts showing signals at each part of the frequency comparator of FIG. 6, in which FIG. 7 shows a case where the VCO oscillation frequency is higher than the bit rate of the input data signal, and FIG. 8 shows a case where the VCO oscillation frequency is lower than the bit rate of the input data signal;

FIG. 11 is a circuit diagram showing a second example of the composition of the sample hold circuit;

FIG. 12 is a circuit diagram showing an example of the composition of a filter which is shown in FIG. 5;

FIGS. 17 and 18 are timing charts showing signals at principal parts of the frequency comparator of FIG. 16, in which FIG. 17 shows a case where the phase of the clock signal is behind that of the input data signal and FIG. 18 shows a case where the phase of the clock signal is ahead of that of the input data signal;

DESCRIPTION OF THE PREFERRED EMBODIMENTS

Figure 1:
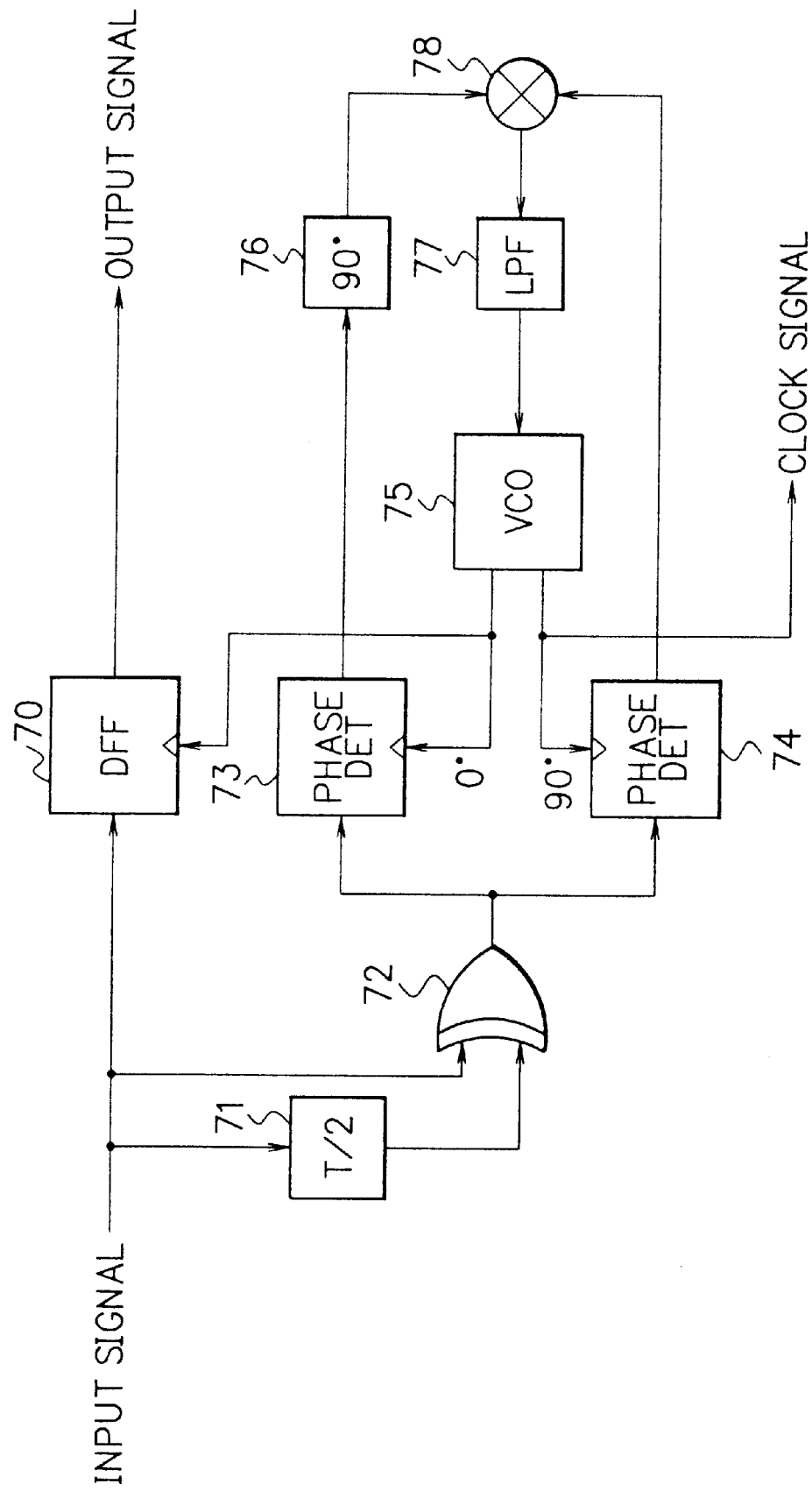
FIG. 1 is a circuit diagram showing a conventional PLL.
Figure 2:
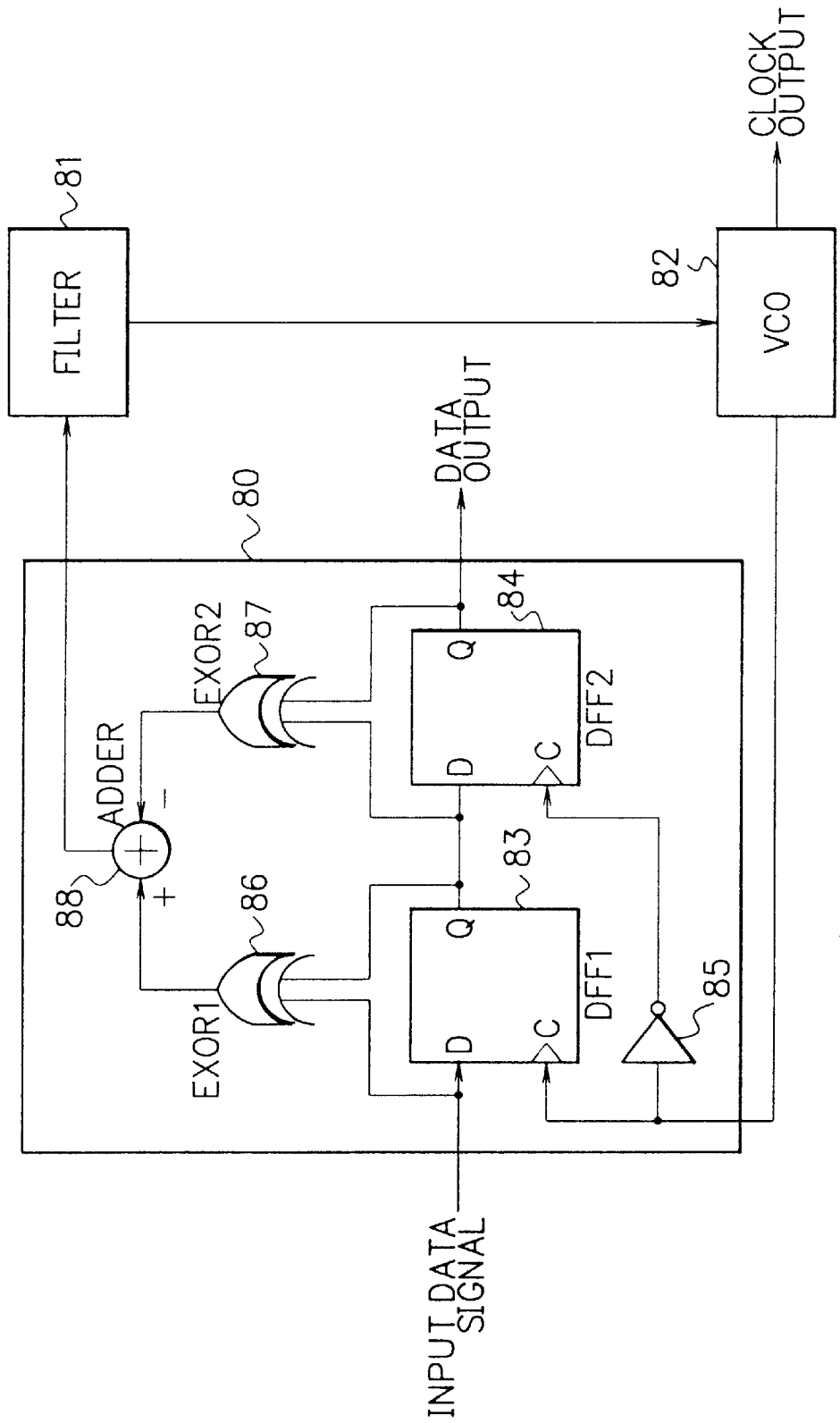
FIG. 2 is a circuit diagram showing another conventional PLL.
Figure 3:
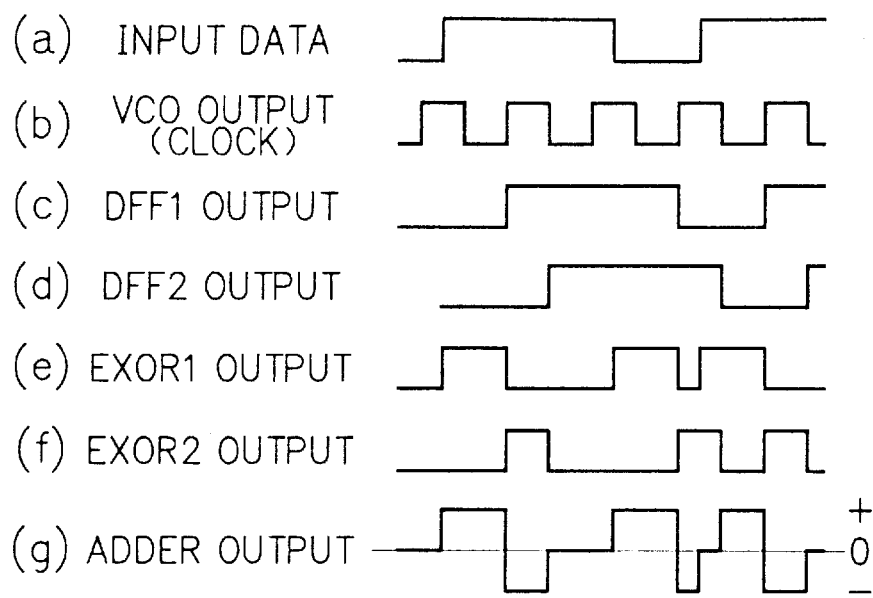
Figure 4:
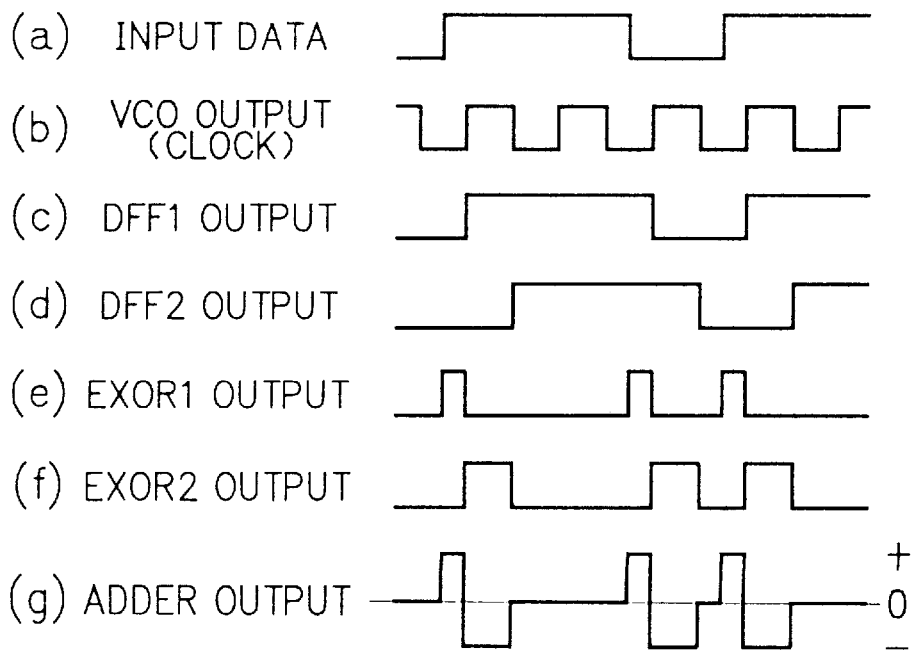

Referring now to the drawings, a description will be given in detail of preferred embodiments in accordance with the present invention.

FIG. 5 is a block diagram showing a PLL (Phase Locked Loop) according to a first embodiment of the present invention. The PLL of FIG. 5 comprises a frequency comparator 1, a phase comparator 2, a filter 3, and a VCO (Voltage Controlled Oscillator) 4. The VCO 4 generates two clock signals CLK1 and CLK2 having the same frequencies and different phases. The phase comparator 2 obtains phase difference between an input data signal and the first clock signal CLK1, and outputs a voltage corresponding to the phase difference. The frequency comparator 1 compares the frequency of the clock signal (CLK1, CLK2) with the frequency (i.e. the bit rate) of the input data signal, and selectively outputs an UP signal for increasing the frequency of the clock signal or a DOWN signal for decreasing the frequency of the clock signal depending on the result of the frequency comparison. The filter 3 removes high frequency components from the output signals of the phase comparator 2 and the frequency comparator 1, and adds the signals together as will be described in detail. The output of the filter 3 is supplied to the VCO 4 as a control signal for controlling the oscillation frequency of the VCO 4. Incidentally, the description will hereafter be given on the assumption that the input data signal is an NRZ (No Return to Zero) signal.

The input data signal and the clock signals generated by the VCO 4 are inputted to the frequency comparator 1 and the phase comparator 2. Concretely, the first clock signal CLK1 is inputted to the frequency comparator 1 and the phase comparator 2, and the second clock signal CLK2 whose phase is ahead of that of the first clock signal CLK1 is inputted to the frequency comparator 1. As for the phases of the two clock signals CLK1 and CLK2, if we describe the phases of the first clock signal CLK1 and the second clock signal CLK2 as $\phi1$ and $\phi2$, a relationship $0° < (\phi2 - \phi1) < 180°$ holds.

In the phase comparator 2, the phase difference between the input data signal and the first clock signal CLK1 is detected, and a voltage corresponding to the phase difference is outputted. In the frequency comparator 1, the frequency difference between the input data signal and the clock signal (CLK1, CLK2) is detected and thereby the DOWN signal (in the case where the clock frequency is higher than the bit rate of the input data signal) or the UP signal (in the case where the clock frequency is lower than the bit rate of the input data signal) is generated and outputted. The filter 3 generates the control signal for controlling the oscillation frequency of the VCO 4, by removing high frequency components from the output signals of the frequency comparator 1 and the phase comparator 2 and adding the signals together. Concretely, the filter 3 generates a control signal for lowering the oscillation frequency of the VCO 4 if the output signal of the phase comparator 2 is indicating that the phase of the clock signal is ahead of that of the input data signal or if the DOWN signal is supplied from the frequency comparator 1. On the other hand, the filter 3 generates a control signal for raising the oscillation frequency of the VCO 4 if the output signal of the phase comparator 2 is indicating that the phase of the clock signal is behind that of the input data signal or if the UP signal is supplied from the frequency comparator 1. The VCO 4 changes its oscillation frequency according to the control signal supplied from the filter 3, and outputs the two clock signals CLK1 and CLK2 of the same frequencies and different phases.

Figure 6:
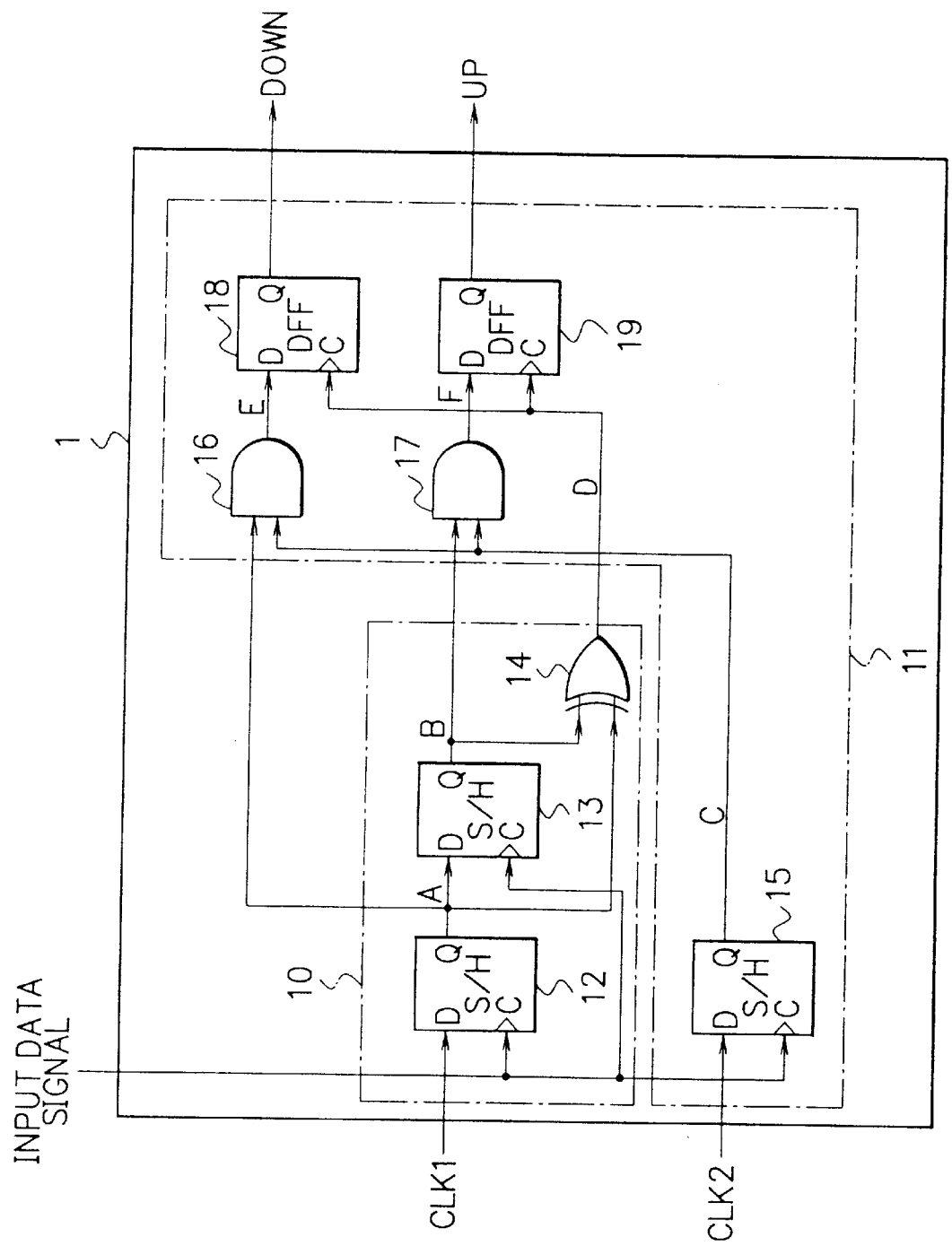
FIG. 6 is a block diagram showing a first example of the composition of a frequency comparator shown in FIG. 5.

In the following, examples of the composition of the frequency comparator 1 will be descried in detail. FIG. 6 is a block diagram showing a first example of the composition of the frequency comparator 1 shown in FIG. 5. The frequency comparator 1 of FIG. 6 is composed of a cycle slip detection circuit 10 and an UP/DOWN signal generation circuit 11.

The cycle slip detection circuit 10 includes a first sample hold circuit 12, a second sample hold circuit 13 and an EXOR circuit 14. The input data signal of the NRZ type is supplied to the clock terminals C of the sample hold circuits 12 and 13. The first clock signal CLK1 is supplied to the data input terminal D of the first sample hold circuit 12. The output of the first sample hold circuit 12 from its output terminal Q is inputted to the data input terminal D of the second sample hold circuit 13. The outputs of the sample hold circuits 12 and 13 from their output terminals Q are supplied to the EXOR circuit 14.

The UP/DOWN signal generation circuit 11 includes a third sample hold circuit 15, a first AND circuit 16, a second AND circuit 17, a first D-FF 18 and a second D-FF 19. The second clock signal CLK2 is supplied to the data input terminal D of the third sample hold circuit 15, and the input data signal is supplied to the clock terminal C of the third sample hold circuit 15. The outputs of the first sample hold circuit 12 and the third sample hold circuit 15 from their output terminals Q are supplied to the first AND circuit 16. The outputs of the second sample hold circuit 13 and the third sample hold circuit 15 from their output terminals Q are supplied to the second AND circuit 17. The output of the EXOR circuit 14 is supplied to the clock terminals C of the D-FFs 18 and 19. The output of the first AND circuit 16 is supplied to the data input terminal D of the first D-FF 18, and the output of the second AND circuit 17 is supplied to the data input terminal D of the second D-FF 19. The DOWN signal is outputted from the output terminal Q of the first D-FF 18, and the UP signal is outputted from the output terminal Q of the second D-FF 19.

Figure 7:
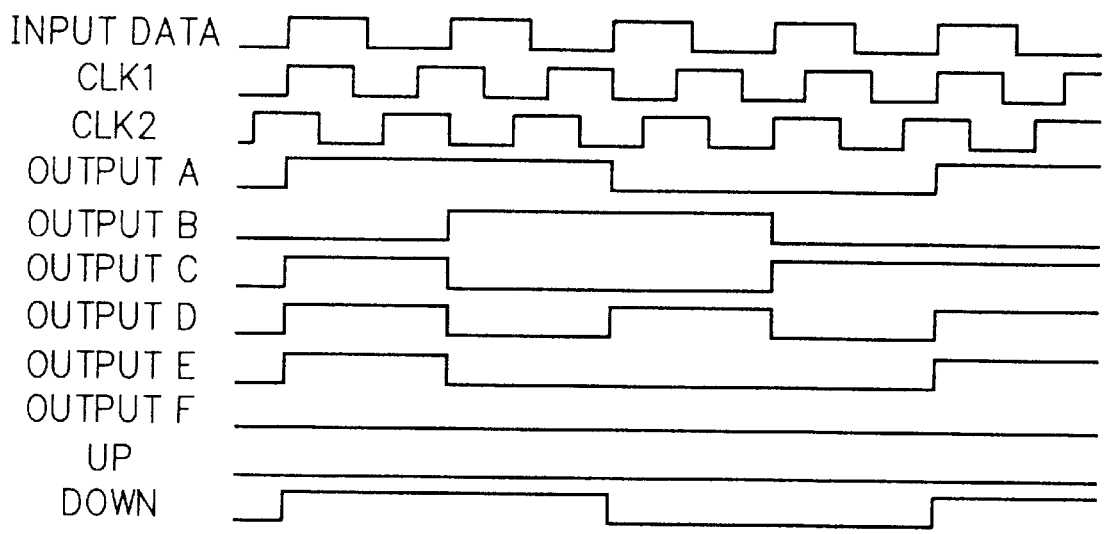
Figure 8:
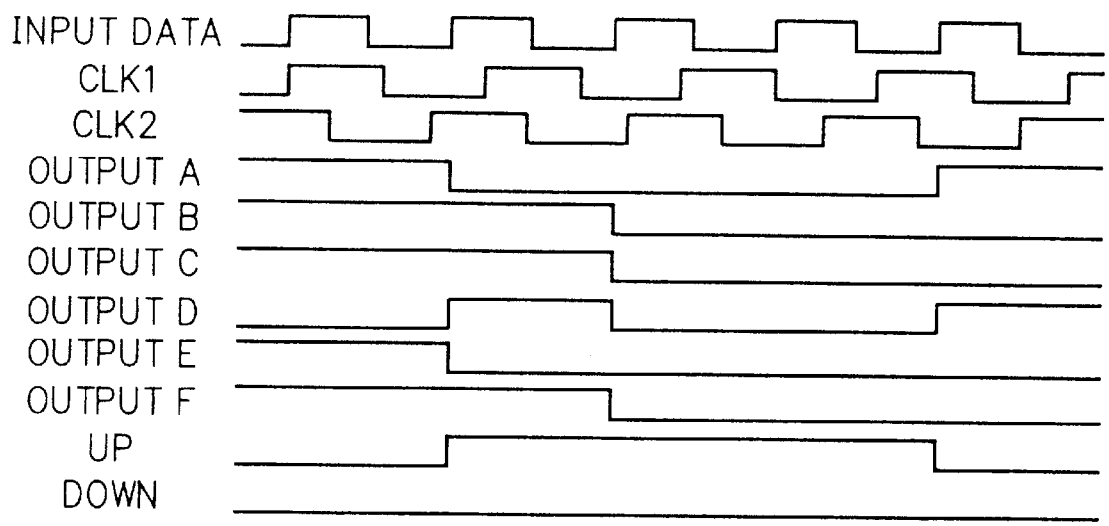

In the following, the operation of the frequency comparator 1 will be descried in detail referring to FIGS. 7 and 8. FIGS. 7 and 8 are timing charts showing signals at each part of the frequency comparator 1 of FIG. 6. FIG. 7 shows a case where the oscillation frequency of the VCO 4 is higher than the bit rate of the input data signal, and FIG. 8 shows a case where the oscillation frequency of the VCO 4 is lower than the bit rate of the input data signal.

Referring to FIGS. 7 and 8, the "CLK1" and "CLK2" denote the clock signals CLK1 and CLK2 having the same frequencies and different phases which are outputted by the VCO 4. The "OUTPUT A" denotes the output signal of the first sample hold circuit 12 shown in FIG. 6, the "OUTPUT B" denotes the output signal of the second sample hold circuit 13 shown in FIG. 6, the "OUTPUT C" denotes the output signal of the third sample hold circuit 15 shown in FIG. 6, the "OUTPUT D" denotes the output signal of the EXOR circuit 14 shown in FIG. 6, the "OUTPUT E" denotes the output signal of the first AND circuit 16 shown in FIG. 6, and the "OUTPUT F" denotes the output signal of the second AND circuit 17 shown in FIG. 6.

Referring to FIG. 7, the output signal D becomes active when sampled data of the first clock signal CLK1 (OUTPUT A) differs from a previous sampled data of the first clock signal CLK1 (OUTPUT B). At the first (convex) pulse of the output signal D, sampled data of the second clock signal CLK2 (OUTPUT C) is "1". Frequency comparison by the frequency comparator 1 is executed and the UP/DOWN signal is outputted in the case where the sampled data of the second clock signal CLK2 (OUTPUT C) is "1". At the moment, the output signal A is "1" and the output signal B is "0", and thus the output signal E of the first AND circuit 16 becomes "1" and the output signal F of the second AND circuit 17 becomes "0". The output signals E and F of the AND circuits 16 and 17 are latched by the first D-FF 18 and the second D-FF 19 respectively, thereby the DOWN signal (for indicating that the frequency of the clock signal (CLK1, CLK2) is higher than the bit rate of the input data signal) becomes active (1) and the UP signal (indicating that the frequency of the clock signal (CLK1, CLK2) is lower than the bit rate of the input data signal) becomes inactive (0).

At the second (convex) pulse of the output signal D, the output signal C is "0", therefore, the moment has no bearing on the judgment with respect to high/low of the clock frequency, and thus the frequency comparison by the frequency comparator 1 is not executed. Concretely, due to the inactive output signal C, the output signals E and F of the AND circuits 16 and 17 become "0" and thereby the outputs of the D-FFs 18 and 19 (i.e. the DOWN signal and the UP signal) become "0".

On the other hand, referring to FIG. 8 showing the case where the frequency of the clock signal is lower than that of the input data signal, the sampled data of the second clock signal CLK2 (OUTPUT C) is also "1" at the first (convex) pulse of the output signal D, however, the output signal A is "0" and the output signal B is "1". Therefore, the output signal E of the first AND circuit 16 becomes "0" and the output signal F of the second AND circuit 17 becomes "1", and thus only the UP signal (indicating that the frequency of the clock signal (CLK1, CLK2) is lower than the frequency of the input data signal) becomes active (1).

At the second (convex) pulse (rising edge) of the output signal D, the output signal C is "0" and thus the outputs of the D-FFs 18 and 19 (i.e. the DOWN signal and the UP signal) become "0". By the operation described above, the frequency of the clock signal (CLK1, CLK2) is compared with the bit rate of the input data signal, and the result of the frequency comparison (the DOWN signal or the UP signal) is returned to the VCO 4 via the filter 3.

Figure 9:
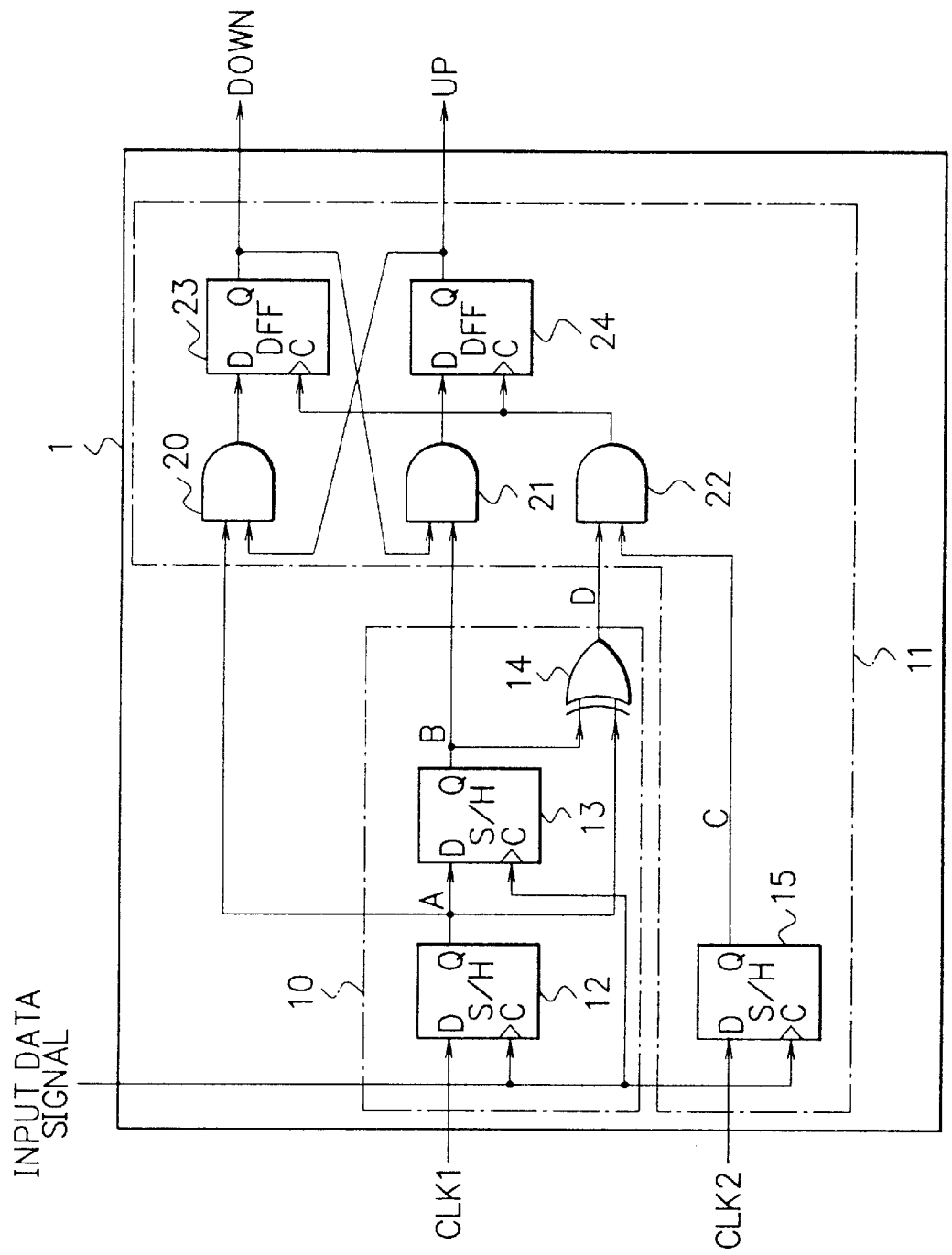
FIG. 9 is a block diagram showing a second example of the composition of the frequency comparator shown in FIG. 5.

In the following, another example of the composition of the frequency comparator 1 will be descried in detail. FIG. 9 is a block diagram showing a second example of the composition of the frequency comparator 1 shown in FIG. 5. The frequency comparator 1 of FIG. 9 is composed of a cycle slip detection circuit 10 and an UP/DOWN signal generation circuit 11 in the same way as the frequency comparator 1 of FIG. 6. The cycle slip detection circuit 10 is the same as that of FIG. 6, however, the UP/DOWN signal generation circuit 11 is a little different. The UP/DOWN signal generation circuit 11 shown in FIG. 9 is composed of a third sample hold circuit 15, a first AND circuit 20, a second AND circuit 21, a third AND circuit 22, a first D-FF 23 and a second D-FF 24. The output signal A of the first sample hold circuit 12 and the output signal of the second D-FF 24 are inputted to the first AND circuit 20. The output signal B of the second sample hold circuit 13 and the output signal of the first D-FF 23 are inputted to the second AND circuit 21. The output of the first AND circuit 20 is inputted to the data input terminal D of the first D-FF 23, and the output of the second AND circuit 21 is inputted to the data input terminal D of the second D-FF 24. The third AND circuit 22 is supplied with the output signal D of the EXOR circuit 14 and the output signal C of the third sample hold circuit 15, and the output of the third AND circuit 22 is supplied to the clock terminals C of the first D-FF 23 and the second D-FF 24. The DOWN signal is outputted from the output terminal Q of the first D-FF 23, and the UP signal is outputted from the output terminal Q of the second D-FF 24.

In the UP/DOWN signal generation circuit 11 of FIG. 9, by use of the third AND circuit 22, the HIGH/LOW judgment of the clock frequency is executed only if the sampled data C of the second clock signal CLK2 is "1" and the sampled data A of the first clock signal CLK1 has just changed its value (that is, if the output of the third AND circuit 22 is "1"). Under the condition, the clock frequency is judged to be higher than the bit rate of the input data signal if the output signal A of the first sample hold circuit 12 is "1", and the clock frequency is judged to be lower than the bit rate of the input data signal if the output signal B of the second sample hold circuit 13 is "1". Further, by the feedback of the output of the first D-FF 23 (for outputting the UP signal) to the second AND circuit 21 and the feedback of the output of the second D-FF 24 (for outputting the DOWN signal) to the first AND circuit 20, comparison with a previous state is executed and thereby the DOWN signal and the UP signal outputted by the first D-FF 23 and the second D-FF 24 are controlled. In the case where the DOWN signal is "1", that is, when the frequency of the clock signal is judged to be higher than that of the input data signal, the output of the first D-FF 23 (i.e. the DOWN signal) does not change if the frequency of the clock signal is judged again to be higher in the next comparison. If the frequency of the clock signal is judged to be lower in the next comparison, the DOWN signal outputted by the first D-FF 23 is turned inactive "0". Similarly, in the case where the UP signal is "1", that is, when the frequency of the clock signal is judged to be lower than that of the input data signal, the output of the second D-FF 24 (i.e. the UP signal) does not change if the frequency of the clock signal is judged again to be lower in the next comparison. The UP signal outputted by the second D-FF 24 is turned inactive "0" if the frequency of the clock signal is judged to be higher in the next comparison.

While the UP/DOWN signals in the case of the frequency comparator 1 of FIG. 6 were outputted as pulses as have been shown in FIGS. 7 and 8, the UP/DOWN signals in the case of the frequency comparator 1 of FIG. 9 keep on being outputted until the HIGH/LOW frequency relationship between the clock signal and the input data signal is reversed, thereby DC gain of the frequency comparator 1 becomes larger, and consequently, synchronization time of the PLL can be shortened.

Figure 10:
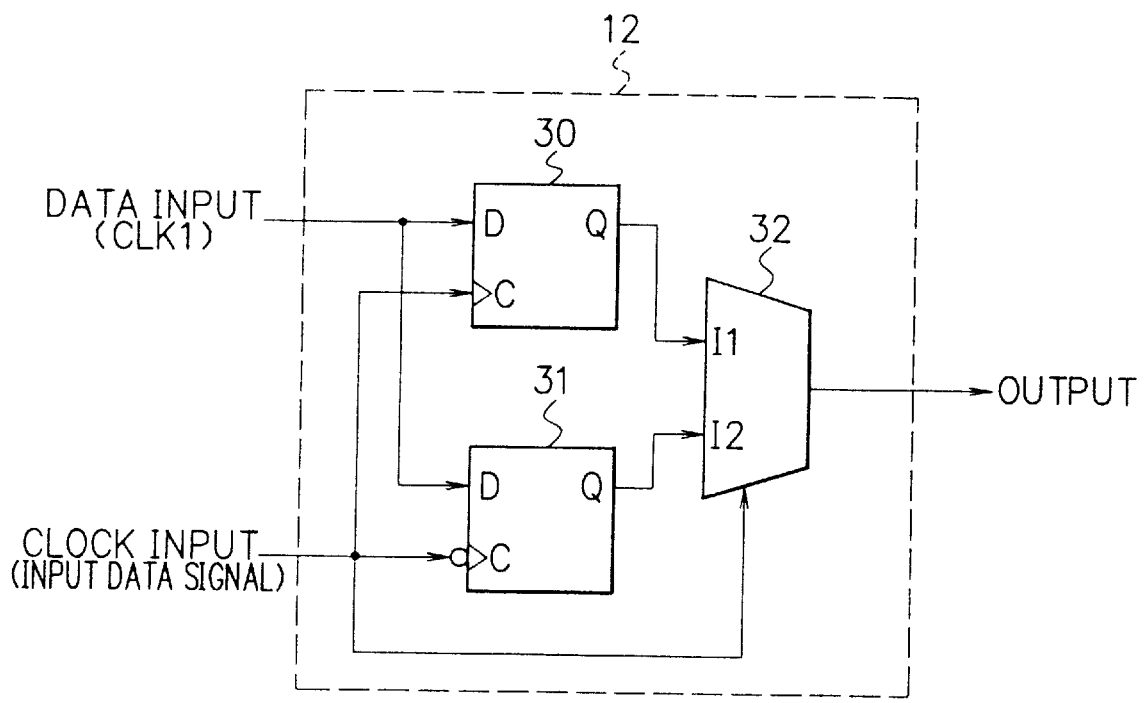
FIG. 10 is a circuit diagram showing a first example of the composition of a sample hold circuit shown in the FIGS. 6 and 9.

In the following, examples of the composition of the sample hold circuit 12 which has been shown in FIGS. 6 and 9 will be described in detail referring to FIG. 10 and FIG. 11. FIG. 10 is a circuit diagram showing a first example of the composition of the sample hold circuit 12. The sample hold circuit 12 of FIG. 10 includes a first latch 30, a second latch 31 and a selector 32. The data input terminal D of the sample hold circuit 12 is connected to the data input terminals D of the first latch 30 and the second latch 31. The clock terminal C of the sample hold circuit 12 is connected to the clock terminal C of the first latch 30, the inverted clock terminal C of the second latch 31 and the selection control terminal of the selector 32. Incidentally, the sample hold circuits 13 and 15 can also be realized by the same composition.

The first latch 30 holds input data from the moment when a rising edge is supplied to its clock terminal C till the moment when a falling edge is supplied to its clock terminal C. On the other hand, the second latch 31 holds input data from the moment when a falling edge is supplied to its inverted clock terminal C till the moment when a rising edge is supplied to its inverted clock terminal C. The output terminals Q of the latches 30 and 31 are connected to input terminals of the selector 32. The selector 32 selects the output of the first latch 30 when a selection control signal (i.e. the input data signal) supplied to its selection control terminal is "1", and selects the output of the second latch 31 when the selection control signal is "0". In the frequency comparator 1 employing the sample hold circuits 12, 13 and 15 having such circuit composition, the frequency comparison between the clock signal and the input data signal can be executed on both rising edges and falling edges of the (NRZ) input data signal.

FIG. 11 is a circuit diagram showing a second example of the composition of the sample hold circuit 12. The sample hold circuit 12 of FIG. 11 is composed of a D-FF 40 only. The data input terminal D of the sample hold circuit 12 is connected to the data input terminal D of the D-FF 40, and the clock terminal C of the sample hold circuit 12 is connected to the clock terminal C of the D-FF 40. Incidentally, the sample hold circuits 13 and 15 can also be realized by the same composition. In the case where the sample hold circuits 12, 13 and 15 having such circuit composition are employed, the frequency comparison between the clock signal and the input data signal is executed on rising edges of the (NRZ) input data signal. The frequency comparison is not executed on falling edges of the input data signal, therefore, the number of times of the frequency comparison is reduced to half in comparison with the case of FIG. 10. However, circuit composition is simplified and power consumption of the PLL can be reduced.

In the following, an example of the composition of the filter 3 shown in FIG. 5 will be described in detail referring to FIG. 12. FIG. 12 is a circuit diagram showing an example of the composition of the filter 3. The filter 3 of FIG. 12 includes a first filter 50 which is provided corresponding to the phase comparator 2, a second filter 51 which is provided corresponding to the frequency comparator 1, and an adder 52 for adding the outputs of the filters 50 and 51 together. The first filter 50 is supplied with the output of the phase comparator 2, and the second filter 51 is supplied with the output of the frequency comparator 1. The second filter 51 is composed of a filter 51-1 to which the UP signal is supplied, a filter 51-2 to which the DOWN signal is supplied, and an adder (subtracter) 51-3. In the second filter 51, high frequency components are removed from the UP signal and the DOWN signal by the filters 51-1 and 51-2 respectively, and thereafter, the UP signal outputted by the filter 51-1 and the DOWN signal outputted by the filter 51-2 are added together by the adder (subtracter) 51-3. In the addition, the DOWN signal outputted by the filter 51-2 is added inversely, that is, subtracted. By such composition of the filter 3 in which a filter 50 corresponding to the frequency comparator 1 and the filter corresponding to the phase comparator 2 are provided independently, time constants of the frequency comparison loop and the phase comparison loop can be set independently and freely.

Figure 13:
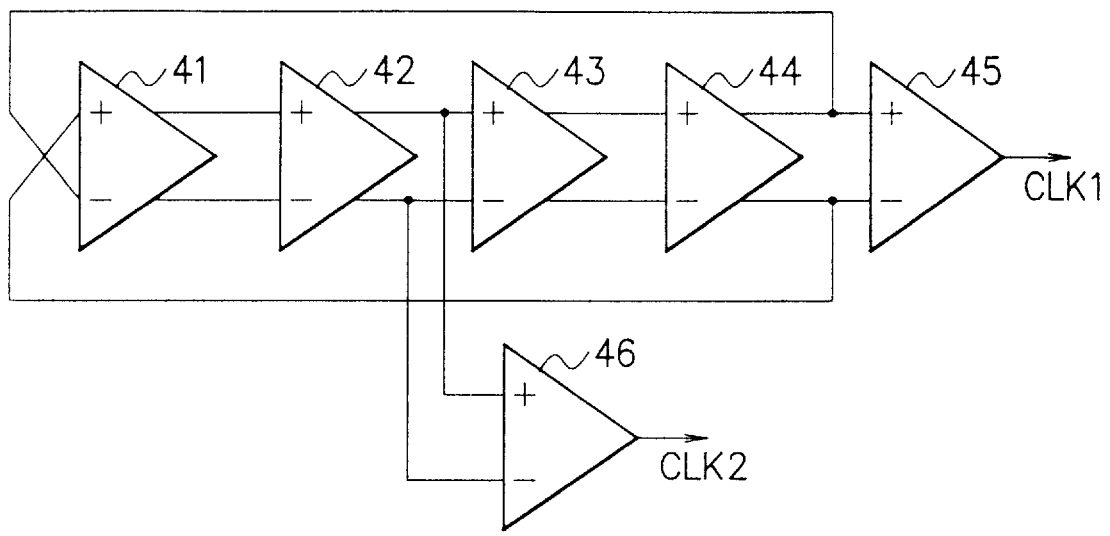
FIG. 13 is a circuit diagram showing a first example of the composition of a VCO which is shown in FIG. 5.

In the following, examples of the composition of the VCO 4 shown in FIG. 5 will be described in detail referring to FIG. 13 and FIG. 14. FIG. 13 is a circuit diagram showing a first example of the composition of the VCO 4. The VCO 4 of FIG. 13 is used for generating a couple of clock signals CLK1 and CLK2 having a phase difference of 90°. The VCO 4 of FIG. 13 is realized by connecting an even number of differential inverters in series so as to form a loop and connecting buffers at the end and the halfway point of the series. In FIG. 13, a buffer 45 is connected to the end of the series, and a buffer 46 is connected to the halfway point. The first clock signal CLK1 is extracted by the buffer 45, and the second clock signal CLK2 whose phase is 90° ahead of the first clock signal CLK1 is extracted by the buffer 46. In the case of FIG. 13, the numbers of the differential inverters between the buffers 45 and 46 in the loop is 2 and 2, thereby the two clock signals CLK1 and CLK2 having the 90° phase difference can be obtained.

Incidentally, each differential inverter (41~44) includes a pair of differential transistors (corresponding to its inverted input terminal and non-inverted input terminal) and a current source for supplying bias currents to the differential transistors. The bias current supplied by the current source is controlled by the output of the filter 3 (which is controlled by the UP/DOWN signal and the output of the phase comparator 2). Concretely, the oscillation frequency of the VCO 4 gets higher when the bias current is made higher, and the oscillation frequency gets lower when the bias current is made lower.

Figure 14:
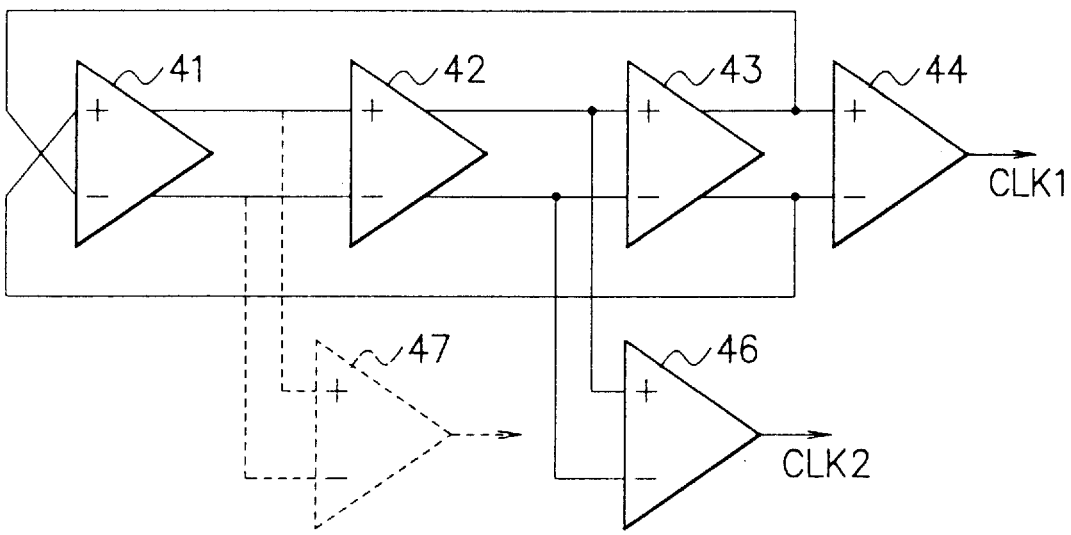
FIG. 14 is a circuit diagram showing a second example of the composition of the VCO.

FIG. 14 is a circuit diagram showing a second example of the composition of the VCO 4. The VCO 4 of FIG. 14 is used for generating a couple of clock signals CLK1 and CLK2 having a phase difference other than 90°. The VCO 4 of FIG. 14 is realized by connecting an odd number of differential inverters in series so as to form a loop and connecting buffers at the end and an arbitrary point of the series. In FIG. 14, a buffer 45 is connected to the end of the series, and a buffer 46 is connected to an arbitrary point of the series. The first clock signal CLK1 is extracted by the buffer 45, and the second clock signal CLK2 whose phase is ahead of the first clock signal CLK1 is extracted by the buffer 46. In the case of FIG. 14, various phase differences between the clock signals CLK1 and CLK2 can be set by varying the position of the buffer 46. For example, when a buffer 47 (shown by broken lines in FIG. 14) instead of the buffer 46 is connected to the series, a second clock signal CLK2 whose phase is ahead of the second clock signal CLK2 of the case of the buffer 46 can be obtained.

In the PLL of the first embodiment, whether the frequency of the clock signal generated by the VC04 is higher or lower than the bit rate of the input data signal is judged by the frequency comparator 1 by use of the two clock signals (CLK1, CLK2) having the same frequencies and different phases. In the frequency comparator 1, the first clock signal CLK1 is sampled at rising edges of the input data signal, and the second clock signal CLK2 is sampled at falling edges of the input data signal. The rising/falling edges (i.e. changing points) of the input data signal are boundaries between time slots of the input data signal, therefore, whether the phase of the clock signal (CLK1/CLK2) is ahead of or behind the phase of the input data signal can be judged by sampling the clock signal (CLK1/CLK2) at changing points of the input data signal.

The frequency comparator 1 executes the HIGH/LOW judgment between the frequency of the clock signal and the bit rate of the input data signal, in consideration of "the timing when one of the clock signals (the first clock signal CLK1, for example) changes its value" and "the value of the other clock signal (the second clock signal CLK2, for example) at the timing (moment)". As the phase difference between the clock signal and the input data signal changes, the sampled data of the first clock signal CLK1 changes its value at a particular point. The change of the sampled data of the first clock signal CLK1 can occur in two ways: "0"→"1" and "1"→"0". Further, if we take the value of the second clock signal CLK2 (sampled data: "0" or "1") at the changing timing in consideration, the sampled data of the second clock signal CLK2 can be "0" or "1" when the change ("0"→"1" or "1"→"0") of the sampled data of the first clock signal CLK1 occurs, therefore, there exist 4 states which represent the relationship between the first clock signal CLK1, the second clock signal CLK2 and the input data signal.

Here, we define a "state #1" as a state in which the sampled data of the second clock signal CLK2 is "0" and the change "0"→"1" of the sampled data of the first clock signal CLK1 occurred, a "state #2" as a state in which the sampled data of the second clock signal CLK2 is "0" and the change "1"→"0" of the sampled data of the first clock signal CLK1 occurred, a "state #3" as a state in which the sampled data of the second clock signal CLK2 is "1" and the change "0"→"1" of the sampled data of the first clock signal CLK1 occurred, and a "state #4" as a state in which the sampled data of the second clock signal CLK2 is "1" and the change "1"→"0" of the sampled data of the first clock signal CLK1 occurred.

If we assume that the current state is near the state #1 or #2 when the clock signal is synchronized with the input data signal, in the case where the frequency of the clock signal is higher than the bit rate of the input data signal, the phase of the sampling point of the clock signal by the input data signal moves forward, that is, the current state changes from the state #1 or the state #2 to the state #3. On the other hand, in the case where the frequency of the clock signal is lower than the bit rate of the input data signal, the phase of the sampling point of the clock signal by the input data signal moves backward, that is, the current state changes from the state #1 or the state #2 to the state #4.

If we assume that the current state is near the state #3 or #4 when the clock signal is synchronized with the input data signal, in the case where the frequency of the clock signal is higher than the bit rate of the input data signal, the phase of the sampling point of the clock signal by the input data signal moves forward, that is, the current state changes from the state #3 or the state #4 to the state #2. On the other hand, in the case where the frequency of the clock signal is lower than the bit rate of the input data signal, the phase of the sampling point of the clock signal by the input data signal moves backward, that is, the current state changes from the state #3 or the state #4 to the state #1.

In the frequency comparator 1, the changing point and changing direction ("0"→"1" or "1"→"0") of the first clock signal CLK1 and the value of the second clock signal CLK2 at the changing moment are detected by executing sampling of the clock signals (CLK1, CLK2) by the sample hold circuits, and HIGH/LOW of the frequency of the clock signal in comparison with the input data signal is detected and outputted by use of the logic circuits. The PLL of the first embodiment operates totally digitally, therefore, a PLL having the capability of high speed operation is realized and the PLL is easily applied to Gb/s class high speed circuits.

As described above, in the PLL according to the first embodiment of the present invention, the frequency comparator 1 for enlarging the pull-in frequency range is formed by a digital circuit, thereby a PLL having an enlarged pull-in frequency range and an increased operating frequency can be realized. By such composition, a PLL capable of operating stably against a 2.4 Gb/s NRZ input data signal which is employed in data communication in SDH (Synchronous Digital Hierarchy) can be realized. Further, by applying the digital frequency comparator 1 described above to PLLs for trunk lines (in which a wide pull-in range can not be obtained only by the phase comparator 2), phase lock in the capture range of the (high frequency) VCO can be realized, and thereby a PLL having resistance to variations in temperature and variations in the quality of device elements can be realized. Moreover, in the case where the frequency comparator 1 of FIG. 9 is employed, the synchronization time can be reduced to half or less.

Figure 15:
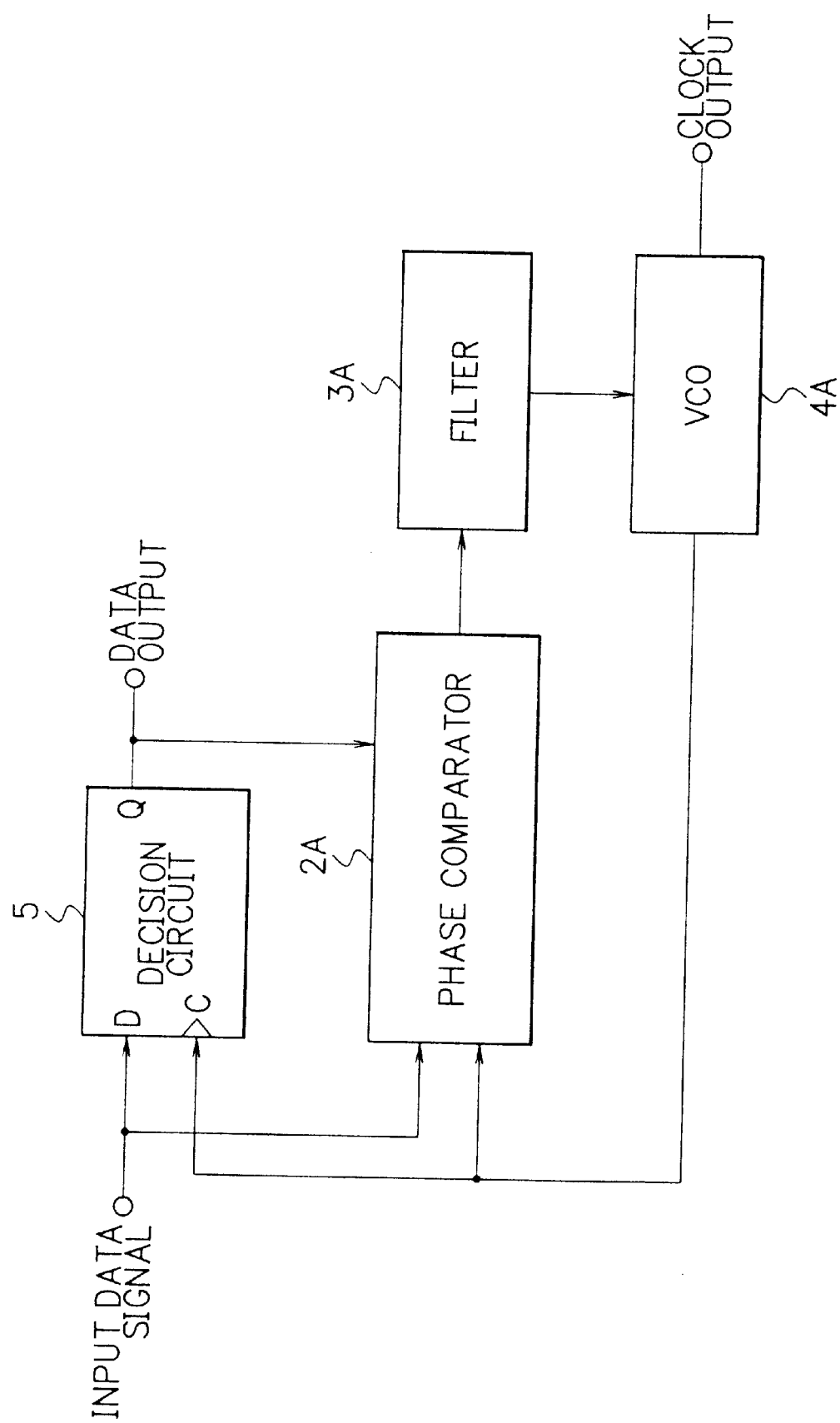
FIG. 15 is a block diagram showing a PLL according to a second embodiment of the present invention.

FIG. 15 is a block diagram showing a PLL according to a second embodiment of the present invention. The PLL of FIG. 15 comprises a phase comparator 2A, a filter 3A, a VCO 4A and a decision circuit 5. The phase comparator 2A, the filter 3A and the VCO 4A are a little different from the phase comparator 2, the filter 3 and the VCO 4 of the first embodiment respectively. The filter 3A is an ordinary low-pass filter having one input, differently from the filter 3 of the first embodiment. Similarly, the VCO 4A is an ordinary VCO generating one clock signal, differently from the VCO 4 of the first embodiment which generates two clock signals. The phase comparator 2A is connected with the decision circuit 5, differently from the phase comparator 2 of the first embodiment. Further, the PLL of the second embodiment is provided with the decision circuit 5 for deciding whether the input data is 0 or 1 and outputting the result of the decision (data recognition/regeneration). The decision circuit 5 is composed of a D-FF, for example. An input data signal of the NRZ type is supplied to the data input terminal D of the decision circuit 5 and a data input terminal of the phase comparator 2A. A clock signal generated and outputted by the VCO 4A is supplied to the clock terminal C of the decision circuit 5 and another data input terminal of the phase comparator 2A.

The decision circuit 5 samples the input data signal on (in sync with) rising edges of the clock signal, and thereby data recognition/regeneration of the input data signal is executed. The sampled data is outputted from the output terminal Q of the decision circuit 5 to outside. The output of the decision circuit 5 (i.e. the sampled data) is also supplied to the phase comparator 2A. The phase comparator 2A executes phase comparison between the clock signal and the input data signal which are supplied to the decision circuit 5. In the comparison, if the phase of the clock signal is ahead of the phase of the input data signal, a signal of a level ("0", for example) indicating that the clock phase is ahead is outputted by the phase comparator 2A in sync with a changing point of the output signal of the decision circuit 5. If the phase of the clock signal is behind the phase of the input data signal, a signal of a level ("1", for example) indicating that the clock phase is behind is outputted by the phase comparator 2A in sync with a changing point of the output signal of the decision circuit 5. In other words, the phase comparator 2A judges whether a rising edge of the clock signal is behind or ahead of the midpoint of a time slot of the input data signal, in sync with a changing point of the output signal of the decision circuit 5, and outputs the result of the judgment as a digital signal.

When the clock signal is synchronized with the input data signal, the average of the output of the phase comparator 2A becomes ½, that is, each rising edge of the clock signal (on which the data recognition/regeneration is executed) comes to the midpoint of each time slot of the input data signal, therefore, the phase adjustment of the clock signal supplied to the decision circuit 5 becomes unnecessary in the PLL of FIG. 15. The phase comparator 2A executes the phase comparison by means of high speed digital operation as will be described later, thereby stable operation against Gb/s class high speed input data signals becomes possible.

The output of the phase comparator 2A is supplied to the filter 3A. The filter 3A generates a control signal by removing high frequency components from the output signal of the phase comparator 2A, and outputs the control signal to the VCO 4A. The VCO 4A changes its oscillation frequency (i.e. the frequency of the clock signal) according to the voltage of the control signal. The clock signal generated by the VCO 4A is supplied to the decision circuit 5 and the phase comparator 2A as mentioned above.

Figure 16:
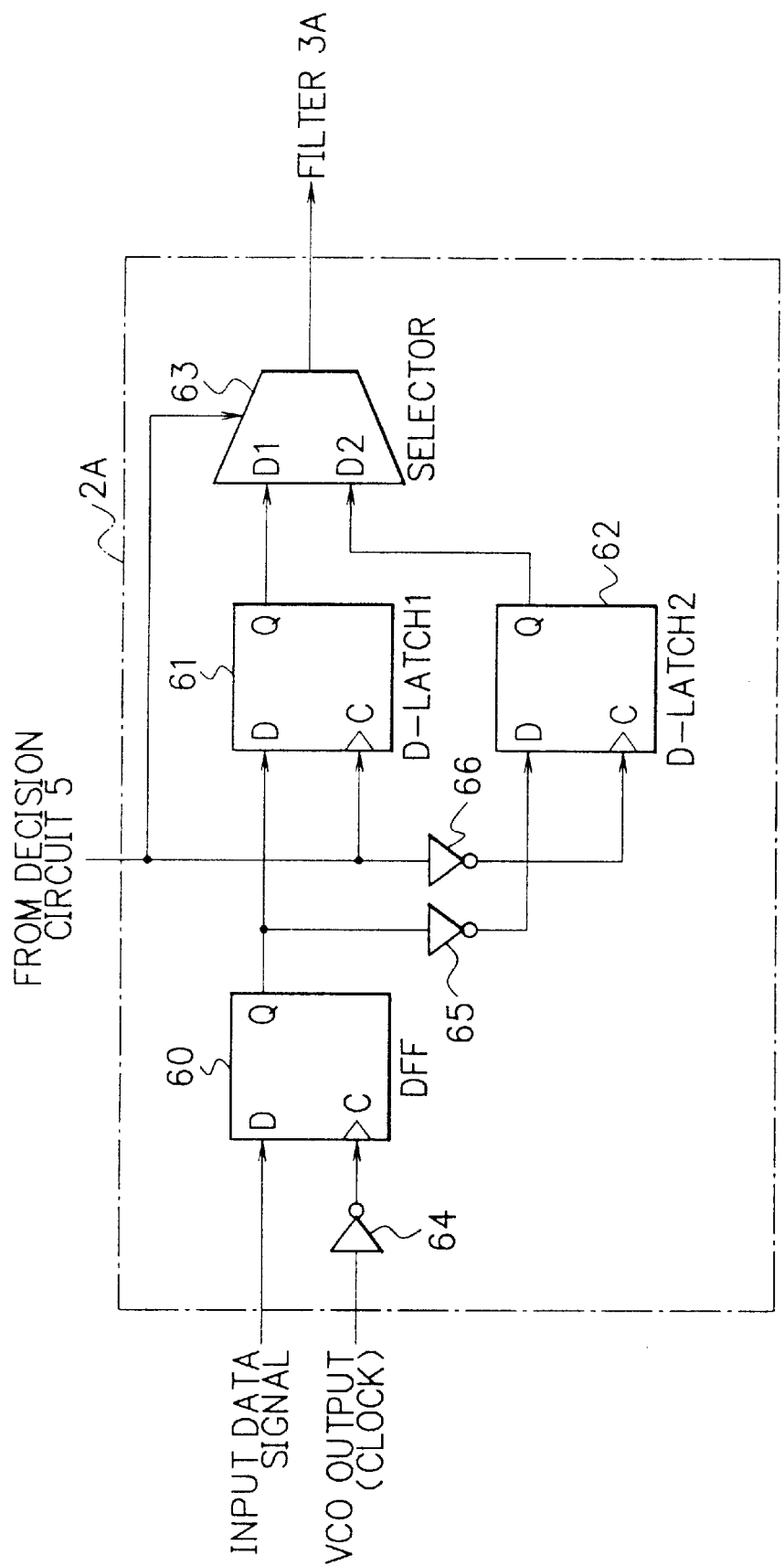
FIG. 16 is a block diagram showing an example of the composition of a phase comparator which is shown in FIG. 15.

In the following, detailed composition of the phase comparator 2A will be described in detail referring to FIG. 16. FIG. 16 is a block diagram showing an example of the composition of the phase comparator 2A. The phase comparator 2A of FIG. 16 includes a D-FF 60, a first D-latch 61, a second D-latch 62, a selector 63, a first inverter 64, a second inverter 65 and a third inverter 66. The input data signal is inputted to the data input terminal D of the D-FF 60, and the clock signal supplied from the VCO 4A is inputted to the clock terminal C of the D-FF 60 via the first inverter 64. Therefore, latching (sampling) timing of the D-FF 60 is out of phase by 180° in comparison with the decision circuit 5. The output of the D-FF 60 is directly supplied to the data input terminal of the first D-latch 61, and is also supplied to the data input terminal of the second D-latch 62 via the second inverter 65, thereby signals having different values are inputted to the data input terminals of the D-latches 61 and 62. The output signal of the decision circuit 5 is directly supplied to the clock terminal of the first D-latch 61, and is also supplied to the clock terminal of the second D-latch 62 via the third inverter 66, thereby signals having different values are inputted to the clock terminals of the D-latches 61 and 62.

By such connection, the first D-latch 61 samples the value of the signal at its data input terminal D when the output signal of the decision circuit 5 changes from "0" (inactive, negative) to "1" (active, positive), and holds the value as long as the output signal of the decision circuit 5 remains "1". Meanwhile, the second D-latch 62 samples the value of the signal at its data input terminal D when the output signal of the decision circuit 5 changes from "1" to "0", and holds the value as long as the output signal of the decision circuit 5 remains "0". The outputs of the first D-latch 61 and the second D-latch 62 are inputted to the data input terminals D1 and D2 of the selector 63. The control terminal of the selector 63 is supplied with the output signal of the decision circuit 5. The selector 63 selects its data input terminal D1 and thereby outputs the output signal of the first D-latch 61 when the output signal of the decision circuit 5 is "1", and selects its data input terminal D2 and thereby outputs the output signal of the second D-latch 62 when the output signal of the decision circuit 5 is "0".

In the following, the operation of the PLL according to the second embodiment of the present invention will be described referring to FIG. 17 and FIG. 18.

Figure 17:
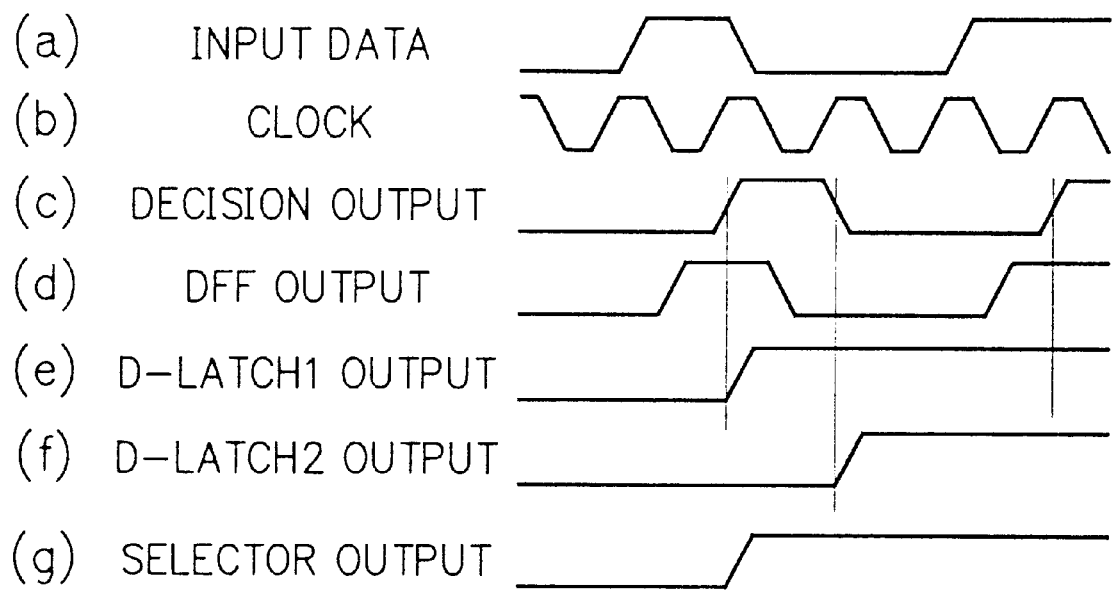

FIG. 17 is a timing chart showing signals at principal parts of the phase comparator 2A in the case where the phase of the clock signal (FIG. 17(b)) is behind the phase of the input data signal (FIG. 17(a)). Incidentally, the expression "behind" is used with respect to falling edges of the clock signal. Referring to FIG. 17, the input data signal (FIG. 17(a)) supplied to the decision circuit 5 is sampled by the decision circuit 5 in sync with a rising edge of the clock signal (FIG. 17(b)). The sampled input data is outputted from the output terminal Q of the decision circuit 5 in the waveform shown in FIG. 17(c).

The input data signal (FIG. 17(a)) supplied to the data input terminal D of the D-FF 60 of the phase comparator 2A is also sampled by the D-FF 60 in sync with a falling edge of the clock signal (FIG. 17(b)). The sampled input data is outputted from the output terminal Q of the D-FF 60 in the waveform shown in FIG. 17(d).

Subsequently, the output signal of the D-FF 60 is sampled by the first D-latch 61 in sync with a rising edge of the output signal of the decision circuit 5, and the sampled signal is outputted from the output terminal Q of the first D-latch 61 in the waveform shown in FIG. 17(e). Meanwhile, the output signal of the D-FF 60 which has been inverted by the second inverter 65 is sampled by the second D-latch 62 in sync with a falling edge of the output signal of the decision circuit 5, and the sampled signal is outputted from the output terminal Q of the second D-latch 62 in the waveform shown in FIG. 17(f).

The output signals of the first D-latch 61 and the second D-latch 62 (FIG. 17(e), (f)) are supplied to the data input terminals D1 and D2 of the selector 63, respectively. The control terminal of the selector 63 is supplied with the output signal of the decision circuit 5, thereby the output of the first D-latch 61 is selected and outputted from the selector 63 (i.e. from the phase comparator 2A) during each period from a rising edge till a falling edge of the output signal of the decision circuit 5 (FIG. 17(g)). During each period from a falling edge till a rising edge of the output signal of the decision circuit 5, the output of the second D-latch 62 is selected and outputted from the selector 63 (i.e. from the phase comparator 2A) (FIG. 17(g)). As shown above, in the case where the phase of the clock signal is behind the phase of the input data signal, the phase comparator 2A outputs a signal of a level "1" so as to advance the phase of the clock signal.

Figure 18:
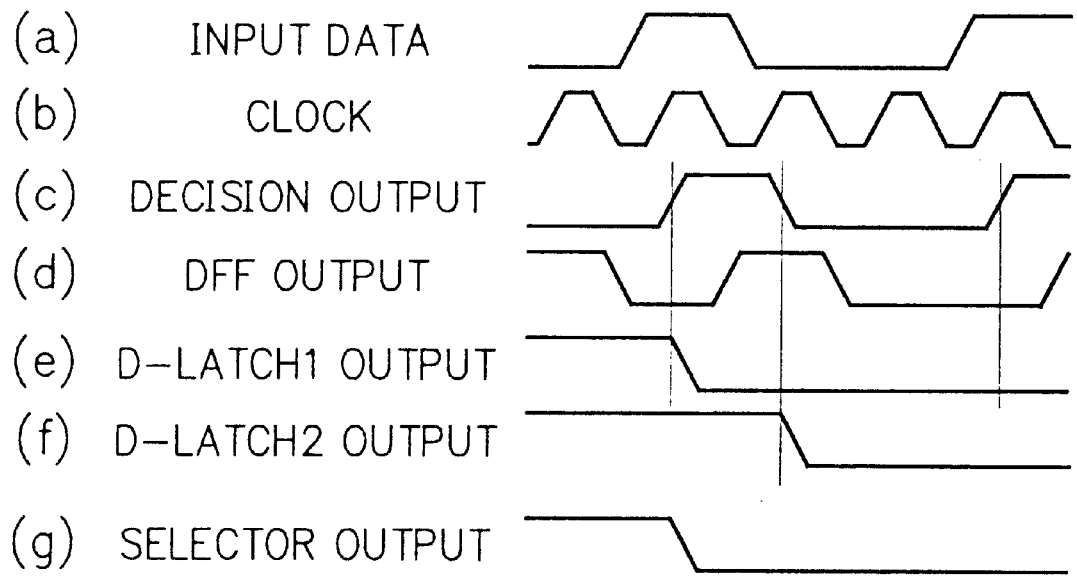

FIG. 18 is a timing chart showing signals at principal parts of the phase comparator 2A in the case where the phase of the clock signal (FIG. 18(b)) is ahead of the phase of the input data signal (FIG. 18(a)). Referring to FIG. 18, the input data signal (FIG. 18(a)) supplied to the decision circuit 5 is sampled by the decision circuit 5 in sync with a rising edge of the clock signal (FIG. 18(b)). The sampled input data is outputted from the output terminal Q of the decision circuit 5 in the waveform shown in FIG. 18(c).

The input data signal (FIG. 18(a)) supplied to the data input terminal D of the D-FF 60 of the phase comparator 2A is also sampled by the D-FF 60 in sync with a falling edge of the clock signal (FIG. 18(b)). The sampled input data is outputted from the output terminal Q of the D-FF 60 in the waveform shown in FIG. 18(d).

Subsequently, the output signal of the D-FF 60 is sampled by the first D-latch 61 in sync with a rising edge of the output signal of the decision circuit 5, and the sampled signal is outputted from the output terminal Q of the first D-latch 61 in the waveform shown in FIG. 18(e). Meanwhile, the output signal of the D-FF 60 which has been inverted by the second inverter 65 is sampled by the second D-latch 62 in sync with a falling edge of the output signal of the decision circuit 5, and the sampled signal is outputted from the output terminal Q of the second D-latch 62 in the waveform shown in FIG. 18(f).

The output signals of the first D-latch 61 and the second D-latch 62 (FIG. 18(e), (f)) are supplied to the data input terminals D1 and D2 of the selector 63, respectively. The control terminal of the selector 63 is supplied with the output signal of the decision circuit 5, thereby the output of the first D-latch 61 is selected and outputted from the selector 63 (i.e. from the phase comparator 2A) during each period from a rising edge till a falling edge of the output signal of the decision circuit 5 (FIG. 18(g)). During each period from a falling edge till a rising edge of the output signal of the decision circuit 5, the output of the second D-latch 62 is selected and outputted from the selector 63 (i.e. from the phase comparator 2A) (FIG. 18(g)). As shown above, in the case where the phase of the clock signal is ahead of the phase of the input data signal, the phase comparator 2A outputs a signal of a level "0" so as to delay the phase of the clock signal.

The output signal of the phase comparator 2A is returned to the VCO 4A via the filter 3A, thereby the clock signal which is in sync with the input data signal is generated by the VCO 4A.

When the clock signal generated by the VCO 4A is synchronized with the input data signal, changing points of the input data signal become almost in sync with falling edges of the clock signal, that is, each rising edge of the clock signal comes to the midpoint of each time slot of the input data signal. The decision circuit 5 executes the data recognition/regeneration in sync with rising edges of the clock signal, therefore, the data recognition/regeneration is executed at the midpoint of each time slot of the input data signal automatically.

As described above, in the PLL according to the second embodiment of the present invention, data recognition/regeneration of the input data signal is executed by the decision circuit 5 in sync with rising edges of the clock signal, and phase comparison between the clock signal and the input data signal is executed by the phase comparator 2A by sampling the input data signal in sync with falling edges of the clock signal and sampling the sampled input data signal in sync with changing points of the output of the decision circuit. Therefore, each rising edge of the clock signal automatically comes to the midpoint of each time slot of the input data signal when the clock signal is synchronized with the input data signal, thereby the decision circuit 5 (which executes data recognition/regeneration in sync with rising edges of the clock signal) can execute the data recognition/regeneration at the midpoint of each time slot of the input data signal. Therefore, the need for the phase adjustment of the clock signal in high speed operation and the effect of variations in quality of device elements can be eliminated. Further, the phase comparator 2A is composed of digital components only, therefore, high speed operation of the PLL with high stability is realized.

Incidentally, while the decision circuit 5 executed the data recognition/regeneration in sync with rising edges of the clock signal and the phase comparator 2A sampled the input data signal in sync with falling edges of the clock signal in the above second embodiment, another equivalent PLL which operates in sync with reverse edges of the clock signal can also be realized. In such a PLL, the decision circuit 5 executes data recognition/regeneration of the input data signal in sync with falling edges of the clock signal, and the phase comparator 2A executes phase comparison between the clock signal and the input data signal by sampling the input data signal in sync with rising edges of the clock signal and sampling the sampled input data signal in sync with changing points of the output of the decision circuit 5. Such a PLL can be formed by adding an inverter in front of the clock terminal of the decision circuit 5 shown in FIG. 15 and removing the first inverter 64 of the phase comparator 2A shown in FIG. 16.

Figure 19:
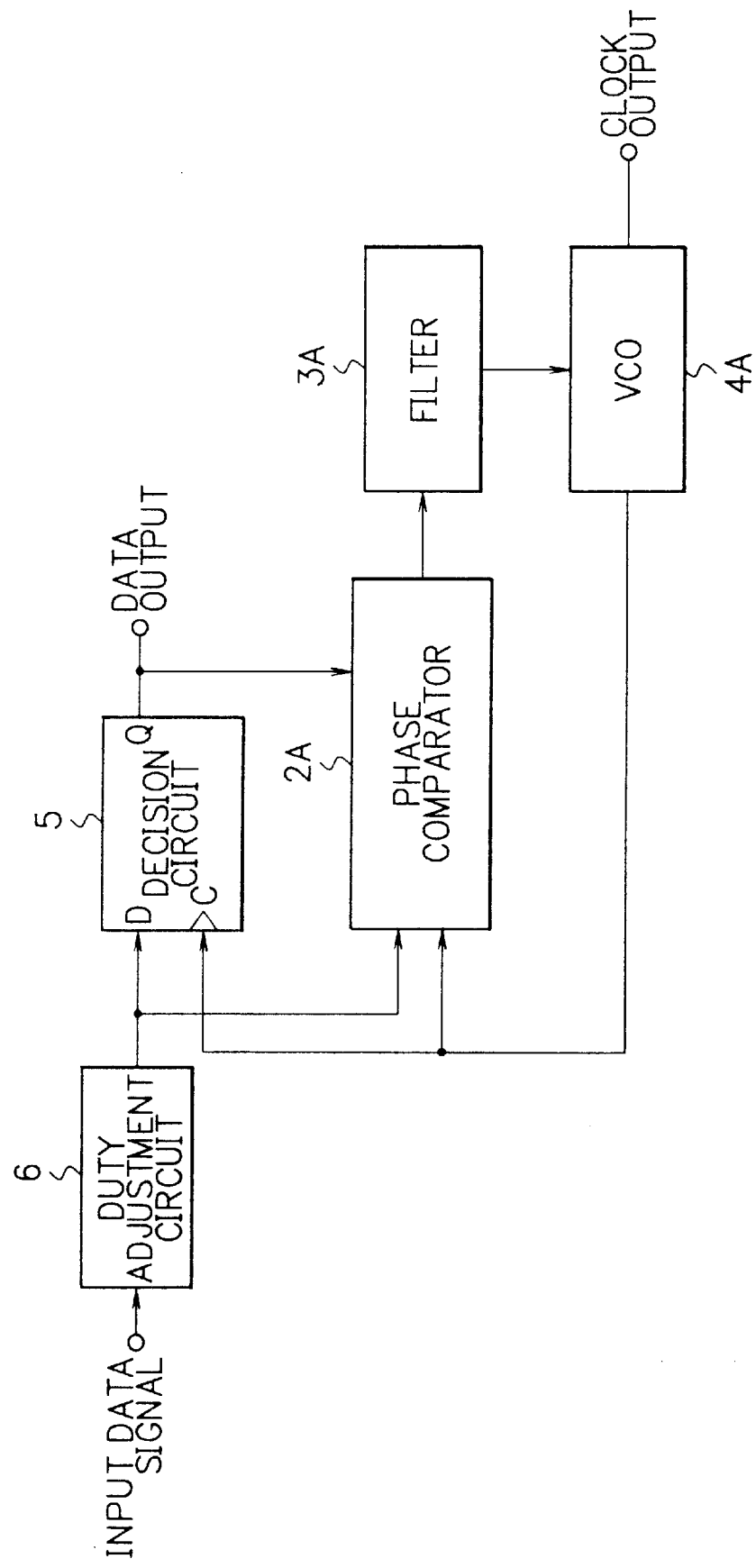
FIG. 19 is a block diagram showing a PLL according to a third embodiment of the present invention.

FIG. 19 is a block diagram showing a PLL according to a third embodiment of the present invention. The PLL of FIG. 19 further comprises a duty adjustment circuit 6 in comparison with the PLL of FIG. 15. The duty adjustment circuit 6 is placed in front of the data input terminals D of the decision circuit 5 and the phase comparator 2A. The PLL of the second embodiment shown in FIG. 15 can not execute the phase comparison using changing points (rising edges and falling edges) of the input data signal properly if the duty rate of the input data signal is not 50%, thereby jitter occurs in the clock signal generated by the VCO 4A. The PLL of the third embodiment employs the duty adjustment circuit 6 for adjusting the duty rate of the input data signal to 50%, in order to let the VCO 4A generate the clock signal having little jitter.

Figure 20:
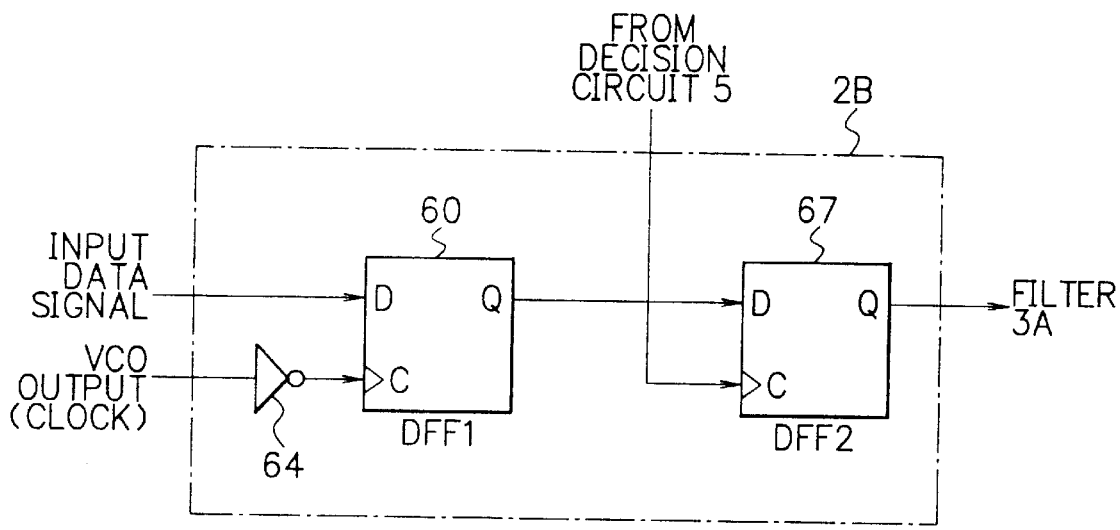
FIG. 20 is a block diagram showing another phase comparator which is employed in a PLL according to a fourth embodiment of the present invention.

FIG. 20 is a block diagram showing another phase comparator 2B which is employed in a PLL according to a fourth embodiment of the present invention. The PLL according of the fourth embodiment employs the phase comparator 2B of FIG. 20 in place of the phase comparator 2A shown in FIGS. 15 and 16. The phase comparator 2B of FIG. 20 is composed of an inverter 64, a first D-FF 60 and a second D-FF 67, in which the second D-FF 67 is employed instead of the inverters 65 and 66, the D-latches 61 and 62 and the selector 63 of the phase comparator 2A of FIG. 16. The input data signal is inputted to the data input terminal of the first D-FF 60, and the clock signal supplied from the VCO 4A is inputted to the clock terminal of the first D-FF 60 via the inverter 64, in the same way as the phase comparator 2A of the second embodiment. The output of the first D-FF 60 is inputted to the data input terminal of the second D-FF 67. The clock terminal of the second D-FF 67 is supplied with the output signal of the decision circuit 5. The output of the second D-FF 67 is supplied to the filter 3A. By such composition of the phase comparator 2B, phase comparison between the clock signal and the input data signal is executed only when the output signal of the decision circuit 5 changes from "0" to "1", that is, only on rising edges of the input data signal. Therefore, phase comparison by the phase comparator 2B can be executed properly even if the duty rate of the input data signal is not 50%.

Incidentally, in the same way as the "equivalent PLL" of the second embodiment, another equivalent PLL according to the fourth embodiment which operates in sync with reverse edges of the clock signal can also be realized. Such a PLL can be formed by adding an inverter in front of the clock terminal of the decision circuit 5 shown in FIG. 15 and removing the first inverter 64 of the phase comparator 2B shown in FIG. 20.

Figure 21:
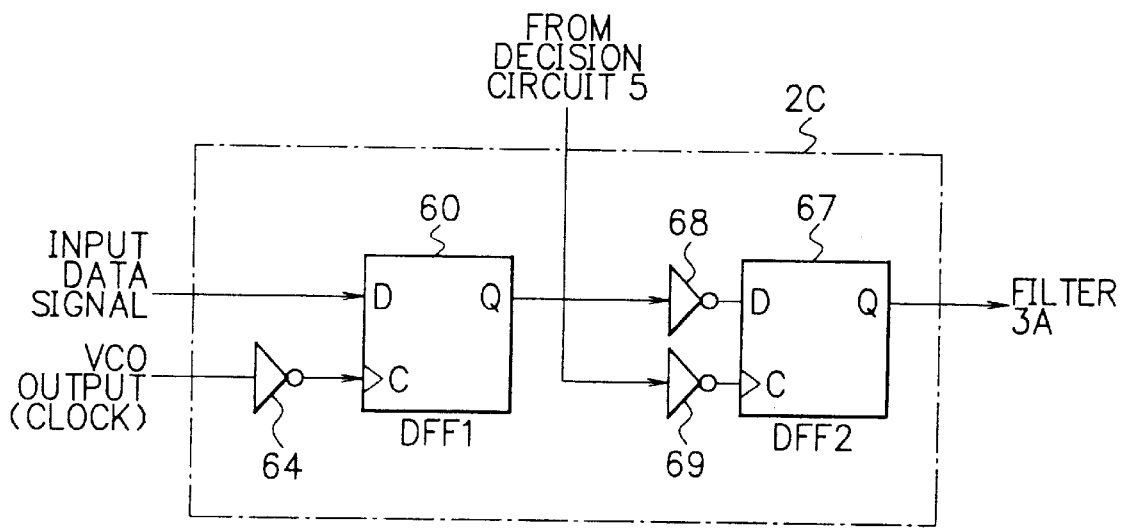
FIG. 21 is a block diagram showing another phase comparator which is employed in a PLL according to a fifth embodiment of the present invention.

FIG. 21 is a block diagram showing another phase comparator 2C which is employed in a PLL according to a fifth embodiment of the present invention. The PLL according of the fifth embodiment employs the phase comparator 2C of FIG. 21 in place of the phase comparator 2A shown in FIGS. 15 and 16. The phase comparator 2C of FIG. 21 further includes a second inverter 68 and a third inverter 69, in comparison with the phase comparator 2B of FIG. 20. The output of the first D-FF 60 is inputted to the data input terminal of the second D-FF 67 via the second inverter 68. The output signal of the decision circuit 5 is inputted to the clock terminal of the second D-FF 67 via the third inverter 69. By such composition of the phase comparator 2C, phase comparison between the clock signal and the input data signal is executed only when the output signal of the decision circuit 5 changes from "1" to "0", that is, only on falling edges of the input data signal, in the opposite manner to the fourth embodiment. Therefore, in the same way as the fourth embodiment, phase comparison by the phase comparator 2C can be executed properly even if the duty rate of the input data signal is not 50%.

Incidentally, also in the fifth embodiment, another equivalent PLL which operates in sync with reverse edges of the clock signal can also be realized. Such a PLL can be formed by adding an inverter in front of the clock terminal of the decision circuit 5 shown in FIG. 15 and removing the first inverter 64 of the phase comparator 2C shown in FIG. 21.

Figure 22:
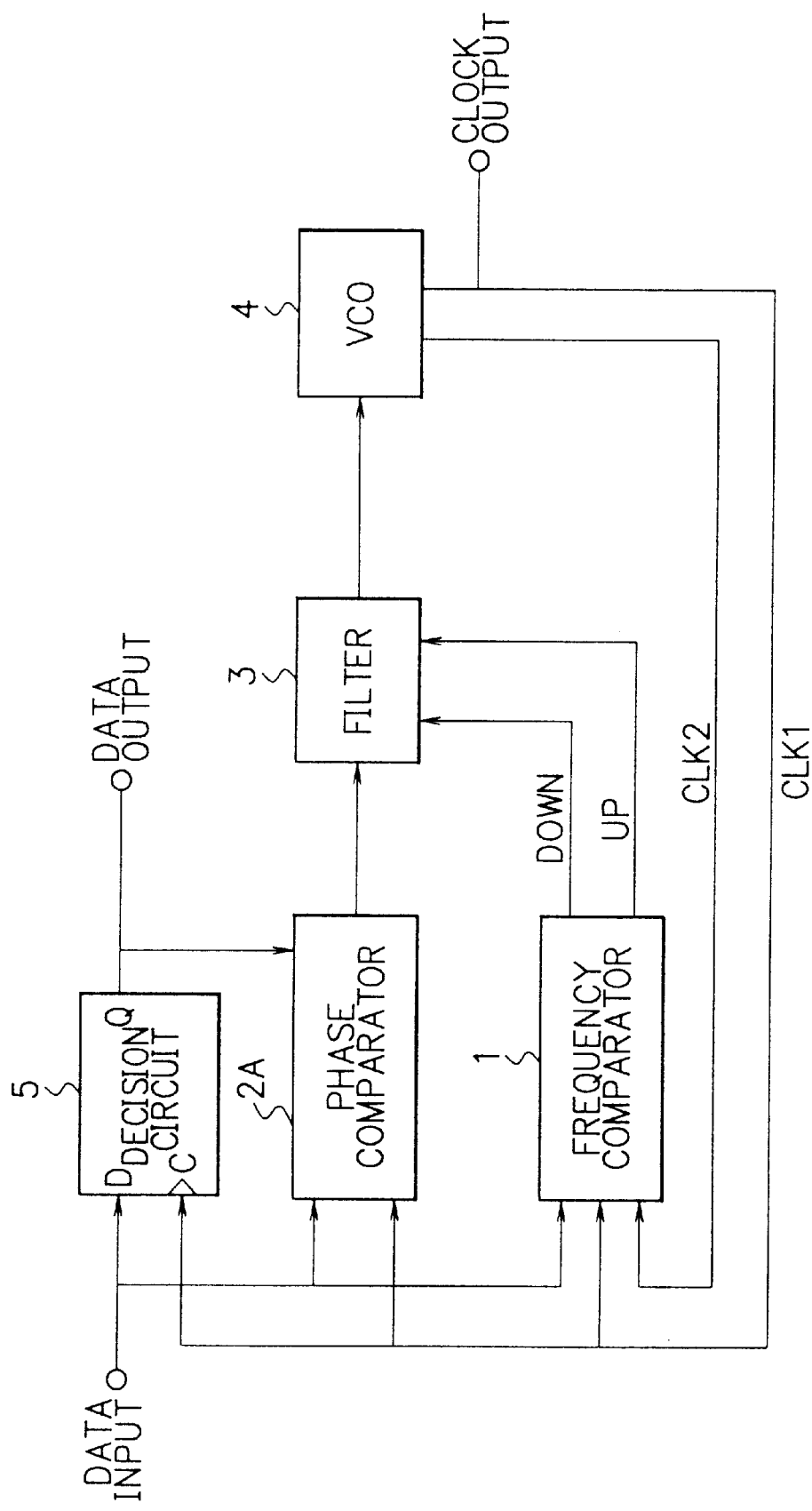
FIG. 22 is a block diagram showing a PLL according to a sixth embodiment of the present invention.

FIG. 22 is a block diagram showing a PLL according to a sixth embodiment of the present invention. The PLL shown in FIG. 22 comprises a decision circuit 5, a phase comparator 2A, a frequency comparator 1, a filter 3 and a VCO 4. The frequency comparator 1, the filter 3 and the VCO 4 are the same as those of the first embodiment which has been shown in FIG. 5. The decision circuit 5 and the phase comparator 2A are the same as those of the second embodiment which has been shown in FIG. 15. The input data signal is supplied to the data input terminal of the decision circuit 5, the phase comparator 2A and the frequency comparator 1. The first clock signal CLK1 generated by the VCO 4 is supplied to the clock terminal of the decision circuit 5, the phase comparator 2A and the frequency comparator 1. The second clock signal CLK2 generated by the VCO 4 is supplied to the frequency comparator 1 in the same way as the first embodiment. In short, the PLL of the sixth embodiment is a combination of the first embodiment and the second embodiment. By the combination, both the effects of the first embodiment and the second embodiment can be obtained. It is also possible to employ the phase comparator 2B of the fourth embodiment or the phase comparator 2C of the fifth embodiment in place of the phase comparator 2A shown in FIG. 22. Further, it is also possible to employ the duty adjustment circuit 6 so as to adjust the duty rate of the input data signal (which is supplied to the decision circuit 5, the phase comparator 2A and the frequency comparator 1 shown in FIG. 22) to approximately 50%, similarly to the third embodiment.

Incidentally, also in the sixth embodiment, another equivalent PLL which operates in sync with reverse edges of the clock signal can also be realized. Such a PLL can be formed by adding an inverter in front of the clock terminal of the decision circuit 5 shown in FIG. 22 and removing the first inverter 64 of the phase comparator 2A, 2B or 2C shown in FIG. 16, 20 or 21.

As set forth hereinabove, according to the present invention, PLLs capable of operating at high speed and with high stability can be realized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A phase locked loop comprising:
   a voltage controlled oscillator whose oscillation frequency is controlled by a control signal, which generates and outputs a first clock signal and a second clock signal whose frequency is the same as that of the first clock signal and whose phase is ahead of that of the first clock signal;
   a phase comparator for executing phase comparison between one of the clock signals and an input data signal, and outputting the result of the phase comparison;
   a frequency comparator for executing frequency comparison between the clock signals and the input data signal based on a time when one of the clock signals changes its value and the value of the other of the second clock signals at the time, and outputting the result of the frequency comparison; and
   a filter for removing high frequency components from the outputs of the phase comparator and the frequency comparator and adding them together and thereby generating the control signal for controlling the oscillation frequency of the voltage controlled oscillator.

2. A phase locked loop as claimed in claim 1, wherein the frequency comparator is composed of digital components.

3. A phase locked loop as claimed in claim 1, wherein the frequency comparator includes:
   a cycle slip detection circuit which samples the first clock signal in sync with changing points of the input data signal, detects change of the value of the sampled first clock signal, and outputs a detection signal when the change of the sampled first clock signal is detected; and
   an UP/DOWN signal generation circuit which judges whether the frequency of the clock signal is higher or lower than the frequency of the input data signal when the cycle slip detection circuit outputted the detection signal based on a sampled data of the second clock signal which is obtained by sampling the second clock signal in sync with a changing point of the input data signal, outputs a DOWN signal for decreasing the oscillation frequency of the voltage controlled oscillator when the frequency of the clock signal is judged to be higher than that of the input data signal, and outputs an UP signal for increasing the oscillation frequency of the voltage controlled oscillator when the frequency of the clock signal is judged to be lower than that of the input data signal.

4. A phase locked loop as claimed in claim 3, wherein the cycle slip detection circuit includes:
   a first sample hold circuit whose clock terminal is supplied with the input data signal and whose data input terminal is supplied with the first clock signal;
   a second sample hold circuit whose clock terminal is supplied with the input data signal and whose data input terminal is supplied with the output of the first sample hold circuit; and
   an EXOR circuit which is supplied with the outputs of the first sample hold circuit and the second sample hold circuit.

5. A phase locked loop as claimed in claim 4, wherein the UP/DOWN signal generation circuit includes:
   a third sample hold circuit whose data input terminal is supplied with the second clock signal and whose clock terminal is supplied with the input data signal;
   a first AND circuit which is supplied with the outputs of the first sample hold circuit and the third sample hold circuit;
   a second AND circuit which is supplied with the outputs of the second sample hold circuit and the third sample hold circuit;
   a first D-FF whose data input terminal is supplied with the output of the first AND circuit and whose clock terminal is supplied with the output of the EXOR circuit; and
   a second D-FF whose data input terminal is supplied with the output of the second AND circuit and whose clock terminal is supplied with the output of the EXOR circuit,
   and thereby the DOWN signal is outputted by the first D-FF and the UP signal is outputted by the second D-FF.

6. A phase locked loop as claimed in claim 4, wherein the UP/DOWN signal generation circuit includes:
   a third sample hold circuit whose data input terminal is supplied with the second clock signal and whose clock terminal is supplied with the input data signal;
   a first AND circuit which is supplied with the outputs of the first sample hold circuit and a second D-FF;
   a second AND circuit which is supplied with the outputs of the second sample hold circuit and a first D-FF;
   a third AND circuit which is supplied with the outputs of the EXOR circuit and the third sample hold circuit;
   the first D-FF whose data input terminal is supplied with the output of the first AND circuit and whose clock terminal is supplied with the output of the third AND circuit; and
   the second D-FF whose data input terminal is supplied with the output of the second AND circuit and whose clock terminal is supplied with the output of the third AND circuit,
   and thereby the DOWN signal is outputted by the first D-FF and the UP signal is outputted by the second D-FF.

7. A phase locked loop as claimed in claim 4, wherein each sample hold circuit of the cycle slip detection circuit includes:
   a first latch whose data input terminal is connected with the data input terminal of the sample hold circuit and whose clock terminal is connected with the clock terminal of the sample hold circuit, which holds data at its data input terminal from the moment when a rising edge is supplied to its clock terminal till the moment when a falling edge is supplied to the clock terminal;
   a second latch whose data input terminal is connected with the data input terminal of the sample hold circuit and whose inverted clock terminal is connected with the clock terminal of the sample hold circuit, which holds data at its data input terminal from the moment when a falling edge is supplied to its inverted clock terminal till the moment when a rising edge is supplied to the inverted clock terminal; and a selector whose input terminals are supplied with the outputs of the first latch and the second latch and whose selection control terminal is supplied with the input data signal supplied to the clock terminal of the sample hold circuit, which selects and outputs the output of the first latch or the output of the second latch depending on the logical value of the input data signal supplied to the selection control terminal.

8. A phase locked loop as claimed in claim 7, wherein the selector selects and outputs the output of the first latch when the logical value of the selection control terminal is "1", and selects and outputs the output of the second latch when the logical value of the selection control terminal is "0".

9. A phase locked loop as claimed in claim 4, wherein each sample hold circuit of the cycle slip detection circuit includes a D-FF whose data input terminal is connected with the data input terminal of the sample hold circuit and whose clock terminal is connected with the clock terminal of the sample hold circuit.

10. A phase locked loop as claimed in claim 1, wherein the filter includes:

a first filter which is provided corresponding to the phase comparator so as to remove high frequency components of the output of the phase comparator;

a second filter which is provided corresponding to the frequency comparator so as to remove high frequency components of the output of the frequency comparator; and an adder for adding the outputs of the first filter and the second filter together.

11. A phase locked loop as claimed in claim 3, wherein the filter includes:

a first filter which is provided corresponding to the phase comparator so as to remove high frequency components of the output of the phase comparator;

a second filter which is provided corresponding to the frequency comparator so as to remove high frequency components of the output of the frequency comparator; and an adder for adding the outputs of the first filter and the second filter together, wherein the second filter generates a voltage for increasing the oscillation frequency of the voltage controlled oscillator when the UP signal is supplied from the frequency comparator, and generates a voltage for decreasing the oscillation frequency of the voltage controlled oscillator when the DOWN signal is supplied from the frequency comparator.

12. A phase locked loop comprising:

a voltage controlled oscillator for generating and outputting a clock signal, whose oscillation frequency is controlled by a control signal;

a decision circuit for executing data recognition/regeneration of an input data signal in sync with rising edges of the clock signal;

a phase comparator for executing phase comparison between the clock signal and the input data signal by sampling the input data signal in sync with falling edges of the clock signal and sampling the sampled input data signal in sync with the output of the decision circuit, and outputting the result of the phase comparison; and a filter for removing high frequency components from the output of the phase comparator and thereby generating the control signal for controlling the oscillation frequency of the voltage controlled oscillator.

13. A phase locked loop as claimed in claim 12, wherein the phase comparator is composed of digital components.

14. A phase locked loop as claimed in claim 12, wherein the phase comparator includes:

a first inverter for inverting the clock signal which is outputted by the voltage controlled oscillator;

a D-FF for sampling the input data signal in sync with rising edges of the clock signal which has been inverted by the first inverter and outputting the sampled data;

a second inverter for inverting the output of the D-FF;

a third inverter for inverting the output of the decision circuit;

a first latch for sampling the output of the D-FF in sync with rising edges of the output of the decision circuit, and holding the sampled data while the output of the decision circuit remains "1";

a second latch for sampling the output of the D-FF which has been inverted by the second inverter in sync with rising edges of the output of the decision circuit which has been inverted by the third inverter, and holding the sampled data while the output of the decision circuit which has been inverted by the third inverter remains "1"; and a selector for selecting and outputting the output of the first latch when the output of the decision circuit is "1", and selecting and outputting the output of the second latch when the output of the decision circuit is "0".

15. A phase locked loop as claimed in claim 12, wherein the decision circuit and the phase comparator are supplied with the input data signal via a duty adjustment circuit which adjusts the duty rate of the input data signal to approximately 50%.

16. A phase locked loop as claimed in claim 12, wherein the phase comparator includes:

a first inverter for inverting the clock signal which is outputted by the voltage controlled oscillator;

a first D-FF for sampling the input data signal in sync with rising edges of the clock signal which has been inverted by the first inverter and outputting the sampled data; and a second D-FF for sampling the output of the first D-FF in sync with rising edges of the output of the decision circuit, and thereby executing phase comparison between the clock signal and the input data signal.

17. A phase locked loop as claimed in claim 16, wherein the second D-FF is supplied with the output of the first D-FF to its data input terminal via a second inverter, and is supplied with the output of the decision circuit to its clock terminal via a third inverter.

18. A phase locked loop comprising:

a voltage controlled oscillator for generating and outputting a clock signal, whose oscillation frequency is controlled by a control signal;

a decision circuit for executing data recognition/regeneration of an input data signal in sync with falling edges of the clock signal;

a phase comparator for executing phase comparison between the clock signal and the input data signal by sampling the input data signal in sync with rising edges of the clock signal and sampling the sampled input data signal in sync with the output of the decision circuit, and outputting the result of the phase comparison; and a filter for removing high frequency components from the output of the phase comparator and thereby generating the control signal for controlling the oscillation frequency of the voltage controlled oscillator.

19. A phase locked loop as claimed in claim 18, wherein the phase comparator is composed of digital components.

20. A phase locked loop as claimed in claim 18, wherein the phase comparator includes:
- a first inverter for inverting the clock signal which is outputted by the voltage controlled oscillator;
- a D-FF for sampling the input data signal in sync with rising edges of the clock signal and outputting the sampled data;
- a second inverter for inverting the output of the D-FF;
- a third inverter for inverting the output of the decision circuit;
- a first latch for sampling the output of the D-FF in sync with rising edges of the output of the decision circuit, and holding the sampled data while the output of the decision circuit remains "1"; and
- a second latch for sampling the output of the D-FF which has been inverted by the second inverter in sync with rising edges of the output of the decision circuit which has been inverted by the third inverter, and holding the sampled data while the output of the decision circuit which has been inverted by the third inverter remains "1"; and
- a selector for selecting and outputting the output of the first latch when the output of the decision circuit is "1", and selecting and outputting the output of the second latch when the output of the decision circuit is "0".

21. A phase locked loop as claimed in claim 18, wherein the decision circuit and the phase comparator are supplied with the input data signal via a duty adjustment circuit which adjusts the duty rate of the input data signal to approximately 50%.

22. A phase locked loop as claimed in claim 18, wherein the phase comparator includes:
- a first D-FF for sampling the input data signal in sync with rising edges of the clock signal and outputting the sampled data; and
- a second D-FF for sampling the output of the first D-FF in sync with rising edges of the output of the decision circuit, and thereby executing phase comparison between the clock signal and the input data signal.

23. A phase locked loop as claimed in claim 22, wherein the second D-FF is supplied with the output of the first D-FF to its data input terminal via a first inverter, and is supplied with the output of the decision circuit to its clock terminal via a second inverter.

24. A phase locked loop comprising:
- a voltage controlled oscillator whose oscillation frequency is controlled by a control signal, which generates and outputs a first clock signal and a second clock signal whose frequency is the same as that of the first clock signal and whose phase is ahead of that of the first clock signal;
- a decision circuit for executing data recognition/regeneration of an input data signal in sync with rising edges of the first clock signal;
- a phase comparator for executing phase comparison between the first clock signal and the input data signal by sampling the input data signal in sync with falling edges of the first clock signal and sampling the sampled input data signal in sync with the output of the decision circuit, and outputting the result of the phase comparison;
- a frequency comparator for executing frequency comparison between the clock signals and the input data signal based on a time when one of the clock signals changes its value and the value of the other of the clock signals at the time and outputting the result of the frequency comparison; and
- a filter for removing high frequency components from the outputs of the phase comparator and the frequency comparator and adding them together and thereby generating the control signal for controlling the oscillation frequency of the voltage controlled oscillator.

25. A phase locked loop as claimed in claim 24, wherein the decision circuit, the phase comparator and the frequency comparator are supplied with the input data signal via a duty adjustment circuit which adjusts the duty rate of the input data signal to approximately 50%.

26. A phase locked loop comprising:
- a voltage controlled oscillator whose oscillation frequency is controlled by a control signal, which generates and outputs a first clock signal and a second clock signal whose frequency is the same as that of the first clock signal and whose phase is ahead of that of the first clock signal;
- a decision circuit for executing data recognition/regeneration of an input data signal in sync with falling edges of the first clock signal;
- a phase comparator for executing phase comparison between the first clock signal and the input data signal by sampling the input data signal in sync with rising edges of the first clock signal and sampling the sampled input data signal in sync with the output of the decision circuit, and outputting the result of the phase comparison;
- a frequency comparator for executing frequency comparison between the clock signals and the input data signal based on the time when one of the clock signals changes its value and the value of the other of the clock signals at the time and outputting the result of the frequency comparison; and
- a filter for removing high frequency components from the outputs of the phase comparator and the frequency comparator and adding them together and thereby generating the control signal for controlling the oscillation frequency of the voltage controlled oscillator.

27. A phase locked loop as claimed in claim 26, wherein the decision circuit, the phase comparator and the frequency comparator are supplied with the input data signal via a duty adjustment circuit which adjusts the duty rate of the input data signal to approximately 50%.

* * * * *